United States Patent
Kim et al.

(10) Patent No.: US 12,237,285 B2
(45) Date of Patent: *Feb. 25, 2025

(54) SEMICONDUCTOR PACKAGE

(71) Applicant: Samsung Electronics Co., Ltd., Suwon-si (KR)

(72) Inventors: Gayoung Kim, Hwaseong-si (KR); Hyungsun Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,545

(22) Filed: Aug. 22, 2023

(65) Prior Publication Data

US 2023/0395548 A1   Dec. 7, 2023

Related U.S. Application Data

(63) Continuation of application No. 17/468,008, filed on Sep. 7, 2021, now Pat. No. 11,769,743.

(30) Foreign Application Priority Data

Feb. 1, 2021   (KR) ........................ 10-2021-0014294

(51) Int. Cl.
    *H01L 23/00*   (2006.01)
(52) U.S. Cl.
    CPC .............. *H01L 24/08* (2013.01); *H01L 24/05* (2013.01); *H01L 24/13* (2013.01);
    (Continued)
(58) Field of Classification Search
    CPC ......... H01L 24/08; H01L 24/05; H01L 24/13; H01L 2224/0401; H01L 2224/05009; H01L 2224/05557; H01L 2224/08059; H01L 2224/13021; H01L 2924/35121; H01L 24/03; H01L 2224/03831; H01L 24/20;
    (Continued)

(56) References Cited

U.S. PATENT DOCUMENTS 6,562,656 B1   5/2003   Ho
8,008,770 B2   8/2011   Lin et al.
(Continued)

FOREIGN PATENT DOCUMENTS

KR   1020010029196 A   4/2001

*Primary Examiner* — Douglas W Owens
(74) *Attorney, Agent, or Firm* — Muir Patent Law, PLLC

(57) ABSTRACT

A semiconductor package includes: a semiconductor chip including a chip pad on a first surface; a first insulating layer arranged on the semiconductor chip and including an insulating hole exposing the chip pad; a redistribution pattern including a redistribution via pattern arranged on an internal surface of the first insulating layer configured to define the first insulating hole and on a surface of the chip pad, and a redistribution line pattern arranged on a surface of the first insulating layer; an under bump metal (UBM) conformally arranged along a surface of the redistribution pattern; and a connection terminal arranged on the UBM, wherein the redistribution line pattern and the UBM provide a dummy space of a shape protruding in a direction toward the first surface of the semiconductor chip, and a portion of the connection terminal fills the dummy space.

20 Claims, 26 Drawing Sheets

(52) U.S. Cl.
CPC ............... *H01L 2224/0401* (2013.01); *H01L 2224/05009* (2013.01); *H01L 2224/05557* (2013.01); *H01L 2224/08059* (2013.01); *H01L 2224/13021* (2013.01); *H01L 2924/35121* (2013.01)

(58) Field of Classification Search
CPC ......... H01L 25/105; H01L 2224/04105; H01L 2224/05011; H01L 2224/05012; H01L 2224/05015; H01L 2224/05018; H01L 2224/05551; H01L 2224/05552; H01L 2224/05555; H01L 2224/05558; H01L 2224/12105; H01L 2224/13006; H01L 2225/1035; H01L 2225/1041; H01L 2225/1058; H01L 23/49816; H01L 23/562; H01L 23/528; H01L 23/485; H01L 23/49838; H01L 23/525; H01L 24/02

See application file for complete search history.

(56) References Cited

U.S. PATENT DOCUMENTS

| | | | |
|---|---|---|---|
| 8,531,015 | B2 | 9/2013 | Marimuthu et al. |
| 9,000,558 | B2 | 4/2015 | Sarfaraz et al. |
| 9,780,024 | B2 | 10/2017 | Kim et al. |
| 10,109,607 | B2 | 10/2018 | Chen et al. |
| 10,446,506 | B2 | 10/2019 | Han et al. |
| 11,769,743 | B2 * | 9/2023 | Kim .................. H01L 24/05 257/737 |
| 2006/0016861 | A1 | 1/2006 | Daubenspeck et al. |
| 2011/0115073 | A1 | 5/2011 | Chen |
| 2011/0248404 | A1 | 10/2011 | Chiu et al. |
| 2021/0265313 | A1 * | 8/2021 | Chen .................. H01L 25/18 |
| 2022/0208819 | A1 * | 6/2022 | Gani ............... H01L 27/14636 |
| 2022/0230969 | A1 * | 7/2022 | Yeh .................... H01L 23/24 |
| 2022/0262699 | A1 * | 8/2022 | Kim .................. H01L 21/561 |

\* cited by examiner

SEMICONDUCTOR PACKAGE

CROSS-REFERENCE TO RELATED APPLICATION

This application is a continuation of U.S. patent application Ser. No. 17/468,008, filed on Sep. 7, 2021, which is based on and claims priority under 35 U.S.C. § 119 to Korean Patent Application No. 10-2021-0014294, filed on Feb. 1, 2021, in the Korean Intellectual Property Office, the entire disclosures of both of which are incorporated by reference herein.

BACKGROUND

The inventive concept relates to a semiconductor package.

The semiconductor package may include a semiconductor chip including a chip pad and a connection terminal electrically connected to the chip pad. Recently, research on a design of a short electrical connection path between the chip pad and the connection terminal, and structural reliability improvement of the semiconductor package has been active.

SUMMARY

The inventive concept provides a semiconductor package in which the structural reliability thereof is improved.

In addition, the inventive concept provides a semiconductor package having a short electrical connection path between a chip pad and a connection terminal.

According to an aspect of the inventive concept, there is provided a semiconductor package including: a semiconductor chip including a chip pad on a first surface of the semiconductor chip; a first insulating layer arranged on the semiconductor chip and including an insulating hole exposing the chip pad; a redistribution pattern including a redistribution via pattern arranged on an internal surface of the first insulating layer that is configured to define the insulating hole and on a surface of the chip pad, and a redistribution line pattern arranged on a surface of the first insulating layer to extend in a horizontal direction and including a first dummy hole; an under bump metal (UBM) including a first UBM portion arranged on the redistribution via pattern, and a second UBM portion extending from the first UBM portion to be arranged on the redistribution via pattern and including a second dummy hole overlapping the first dummy hole in a vertical direction; and a connection terminal arranged on the UBM, and including a dummy portion configured to fill an internal portion of a dummy hole including the first dummy hole of the redistribution line pattern and the second dummy hole of the second UBM portion.

According to another aspect of the inventive concept, there is provided a semiconductor package including: a semiconductor chip including a chip pad on a first surface of the semiconductor chip; a first insulating layer arranged on the semiconductor chip, and including a first insulating hole exposing the chip pad and a second insulating hole spaced apart from the chip pad; a redistribution pattern including a redistribution via pattern arranged on an internal surface of the first insulating layer that is configured to define the first insulating hole and on a surface of the chip pad, a redistribution dummy pattern arranged on an internal surface of the first insulating layer configured to define the second insulating hole and on the first surface of the semiconductor chip, and a redistribution line pattern arranged to extend on a surface of the first insulating layer and configured to connect the redistribution via pattern to the redistribution dummy pattern; a UBM including a first UBM portion arranged on the redistribution via pattern, a second UBM portion extending from the first UBM portion and arranged on the redistribution line pattern, and a UBM dummy portion extending from the second UBM portion and arranged on the redistribution dummy pattern; and a connection terminal arranged on the UBM, and including a dummy portion configured to fill a dummy groove formed by the UBM dummy portion.

According to another aspect of the inventive concept, there is provided a semiconductor package including: a semiconductor chip including a chip pad on a first surface of the semiconductor chip; a first insulating layer arranged on the semiconductor chip, and including a first insulating hole exposing the chip pad; a redistribution pattern including a redistribution via pattern arranged on an internal surface of the first insulating layer that is configured to define the first insulating hole and on a surface of the chip pad, and a redistribution line pattern arranged on a surface of the first insulating layer; a UBM conformally arranged along a surface of the redistribution pattern; and a connection terminal arranged on the UBM, wherein the redistribution line pattern and the UBM provide a dummy space of a shape protruding in a direction toward the first surface of the semiconductor chip spaced apart from the chip pad, and wherein a portion of the connection terminal fills the dummy space.

A redistribution pattern of a semiconductor package and a UBM of a semiconductor package according to the inventive concept provide a dummy space of a shape protruding in a direction toward the semiconductor chip spaced apart from a chip pad, and a portion of a connection terminal fills the dummy space. Accordingly, stress that occurs in a fabrication operation of the semiconductor package may be distributed into the dummy space, and the structural reliability of the fabricated semiconductor package is improved.

In addition, the chip pad, the redistribution pattern, the UBM, and the connection terminal may overlap each other in a vertical direction. Accordingly, the semiconductor package may have a short electrical connection path between the chip pad and the connection terminal.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings.

DETAILED DESCRIPTION OF THE EMBODIMENTS

Hereinafter, embodiments of the inventive concept will be described in detail with reference to the accompanying drawings.

Figure 1:
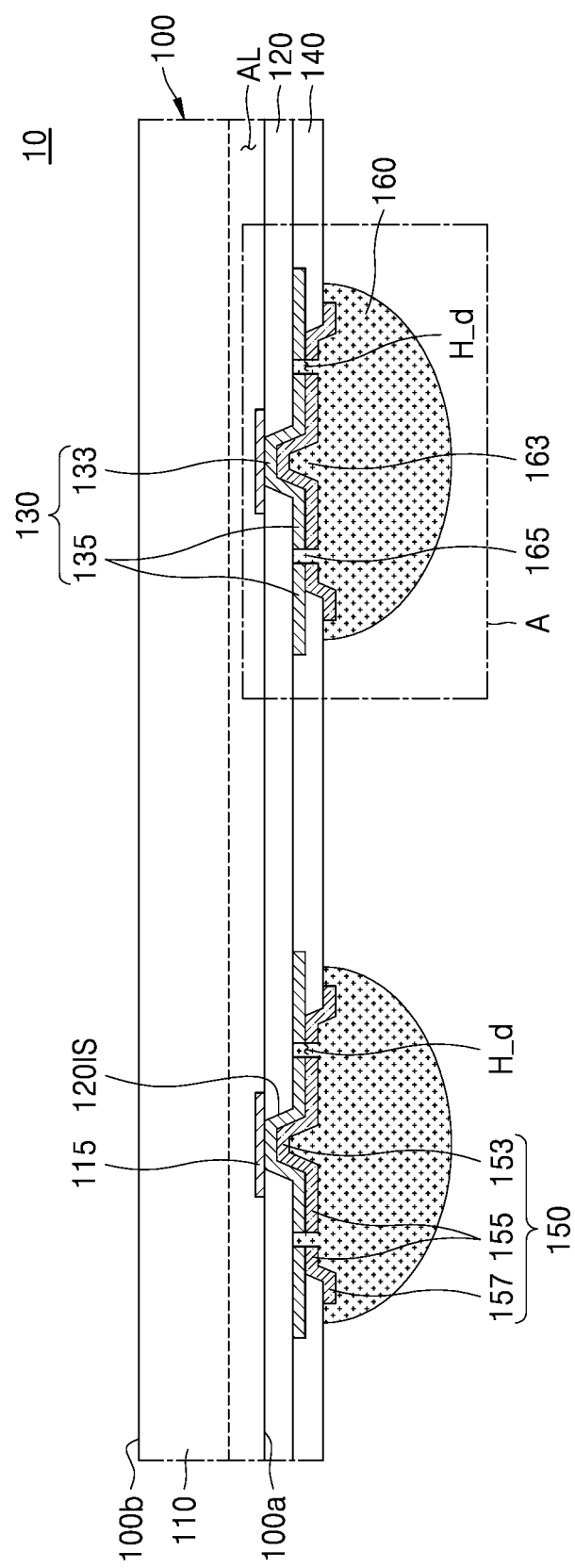
FIG. 1 is a cross-sectional view of a semiconductor package, according to an example embodiment.

FIG. 1 is a cross-sectional view of a semiconductor package 10 according to an example embodiment. In addition, FIG. 2 is an enlarged diagram of a region A in FIG. 1.

The semiconductor package 10 according to the example embodiment may include a semiconductor package fabricated at a wafer level. However, the embodiment is not limited thereto, and the semiconductor package 10 may include a semiconductor package fabricated at a panel level.

Figure 2:
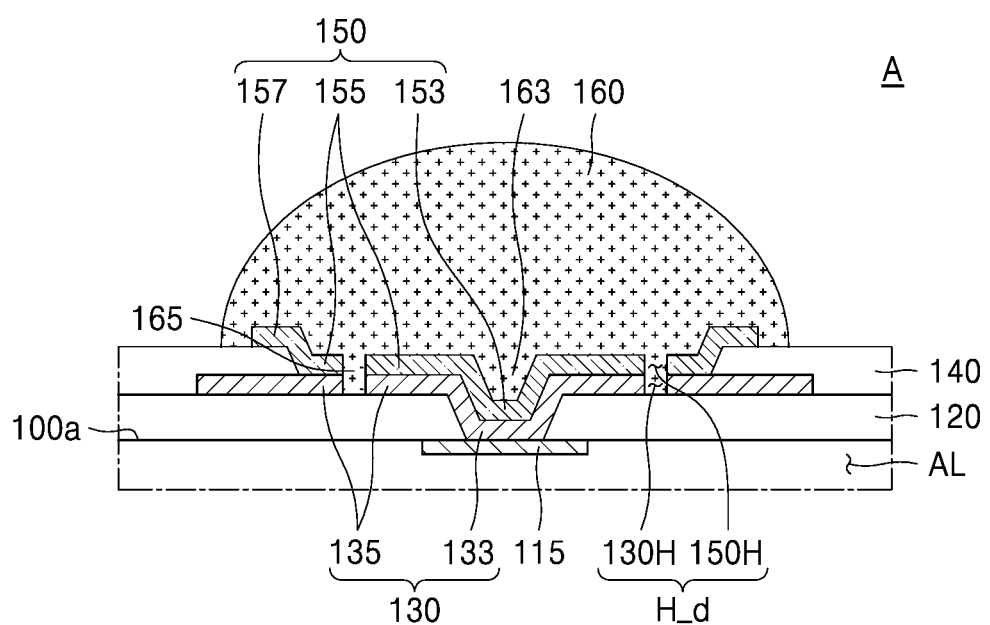
FIG. 2 is an enlarged diagram of a region A in FIG. 1.

Referring to FIGS. 1 and 2 together, the semiconductor package 10 may include a semiconductor chip 100, a first insulating layer 120, a redistribution pattern 130, a second insulating layer 140, an under bump metal (UBM) 150, and a connection terminal 160.

The semiconductor chip 100 may include a semiconductor substrate 110 and a chip pad 115. The semiconductor chip 100 may include a first surface 100a on which the chip pad 115 is arranged and a second surface 100b opposite to the first surface 100a. In addition, the first surface 100a may include one surface of the semiconductor chip 100 adjacent to an active layer AL.

Hereinafter, a direction in parallel with a direction in which the first surface 100a and the second surface 100b of the semiconductor chip 100 extend may be defined as a horizontal direction, and a direction perpendicular to the direction in which the first surface 100a and the second surface 100b of the semiconductor chip 100 extend may be defined as a vertical direction.

In an embodiment, the semiconductor chip 100 may include a logic semiconductor chip. The logic semiconductor chip may include, for example, a central processing unit (CPU), microprocessor unit (MPU), a graphics processing unit (GPU), or an application processor (AP). In addition, the semiconductor chip 100 may include a memory semiconductor chip. The memory semiconductor chip may include a volatile memory semiconductor chip such as dynamic random access memory (RAM) (DRAM) and static RAM (SRAM), and a non-volatile memory semiconductor chip such as phase change RAM (PRAM), magneto-resistive RAM (MRAM), ferroelectric RAM (FeRAM), and resistive RAM (RRAM).

The semiconductor substrate 110 of the semiconductor chip 100 may include silicon (Si). In addition, the semiconductor substrate 110 may include a semiconductor element such as germanium (Ge), and a compound semiconductor such as silicon carbide (SiC), gallium arsenide (GaAs), and indium phosphide (InP).

In an embodiment, the semiconductor substrate 110 may, on a portion thereof adjacent to the first surface 100a, include the active layer AL. For example, the active layer AL may be formed on a portion of the semiconductor substrate 110 adjacent to the redistribution pattern 130.

In an embodiment, the active layer AL may include a plurality of individual devices of various types. For example, the plurality of individual devices may include various microelectronic devices, for example, an image sensor such as a complementary metal-oxide semiconductor (CMOS) transistor, a metal-oxide-semiconductor field effect transistor (MOSFET), a system large scale integration (LSI), and a CMOS imaging sensor (CIS), a micro-electro-mechanical system (MEMS), an active element, a passive element, or the like.

The chip pad 115 of the semiconductor chip 100 may be arranged on the first surface 100a, and may include a pad electrically connected to the plurality of individual devices on the active layer AL of the semiconductor substrate 110. The chip pad 115 of the semiconductor chip 100 may be provided as a plurality of chip pads 115.

In an embodiment, a material of the chip pad 115 may include aluminum (Al). However, the embodiment is not limited thereto, and the material of the chip pad 115 may include a metal such as nickel (Ni), copper (Cu), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru), or an alloy thereof.

The first insulating layer 120 may include a layer of an insulating material arranged on the first surface 100a of the semiconductor chip 100. The first insulating layer 120 may include an oxide or a nitride. For example, the first insulating layer 120 may include silicon oxide or silicon nitride. In addition, the first insulating layer 120 may include an insulating material of a photo imageable dielectric (PID) material capable of being processed by a photolithography process. For example, the first insulating layer 120 may include photosensitive polyimide (PSPI).

The first insulating layer 120 may include an insulating hole (e.g., insulating hole 120H in FIG. 10A) exposing the chip pad 115 of the semiconductor chip 100. In addition, the first insulating layer 120 may include an internal surface 120IS defining the insulating hole 120H. The insulating hole 120H of the first insulating layer 120 may provide a space in which a redistribution via pattern 133 of the redistribution pattern 130 and a first UBM portion 153 of the UBM 150, to be described later, are arranged. For example, the insulating hole 120H of the first insulating layer 120 may have a tapered shape in which a width in the horizontal direction is reduced toward the chip pad 115.

The redistribution pattern 130 may include a pattern of a conductive material electrically connected to the chip pad 115 of the semiconductor chip 100. In addition, the redistribution pattern 130 may include the redistribution via pattern 133 and a redistribution line pattern 135.

The redistribution via pattern 133 may include a portion of the redistribution pattern 130 in contact with the chip pad 115 of the semiconductor chip 100. In addition, the redistribution via pattern 133 may be in contact with the internal surface 120IS defining the insulating hole 120H of the first insulating layer 120. In an embodiment, the redistribution via pattern 133 may be conformally arranged along one side of the internal surface 120IS defining the insulating hole 120H of the first insulating layer 120 and along one side of the chip pad 115, and may be electrically connected to the chip pad 115. In addition, the redistribution via pattern 133 may have a shape convexly bent in a direction toward the chip pad 115.

In addition, the redistribution line pattern 135 may be connected to the redistribution via pattern 133, and may include a portion of the redistribution pattern 130 extending in the horizontal direction on a surface of the first insulating layer 120. In example embodiments, the redistribution pattern 130, including the redistribution via pattern 133 and the redistribution line pattern 135, may be a homogeneous monolithic structure. For example, the redistribution via pattern 133 and the redistribution line pattern 135 may be formed at the same time and of the same material, without a break in the continuity of the material of which they are formed.

In an embodiment, the redistribution line pattern 135 may include a first dummy hole 130H penetrating a portion of the redistribution line pattern 135 in the vertical direction. In addition, the first dummy hole 130H of the redistribution line pattern 135 may be formed on an outer surface of the chip pad 115. For example, the first dummy hole 130H may not overlap the chip pad 115 in the vertical direction.

The first dummy hole 130H of the redistribution line pattern 135 may be defined by an internal surface of the redistribution line pattern 135 and a surface of the first insulating layer 120, and may include a dummy space accommodating a portion of the connection terminal 160. The first dummy hole 130H of the redistribution line pattern 135 may overlap a second dummy hole 150H of the UBM 150 in the vertical direction.

In an embodiment, a material of the redistribution pattern 130 may include copper (Cu). However, the embodiment is not limited thereto, and the material of the redistribution pattern 130 may include a metal such as Ni, Cu, Au, Ag, W, Ti, Ta, In, Mo, Mn, Co, Sn, Mg, Re, Be, Ga, and Ru, or an alloy thereof.

In an embodiment, the redistribution pattern 130 may be arranged between the UBM 150 and the chip pad 115, and between the UBM 150 and the first insulating layer 120, and may further include a redistribution seed layer (not illustrated) arranged between the redistribution line pattern 135 and the first insulating layer 120.

In an embodiment, the redistribution seed layer may be formed by performing a physical vapor deposition process, and the redistribution via pattern 133 and the redistribution line pattern 135 may be formed by performing a plating process.

In an embodiment, a material of the redistribution seed layer may include Ti, TiW, Ti nitride (TiN), Ta, Ta nitride (TaN), Cr, Al, or a combination thereof. For example, a structure of the redistribution seed layer may include Cu/Ti in which Cu is stacked on Ti, or Cu/TiW in which Cu is stacked on TiW. However, the material of the redistribution seed layer is not limited thereto.

In addition, when Cu is used for the redistribution via pattern 133 and the redistribution line pattern 135, at least portions of the redistribution seed layer may work as dispersion barrier layers.

The second insulating layer 140 may be arranged on the first insulating layer 120, and may include a layer of an insulating material covering a portion of the redistribution pattern 130. The second insulating layer 140 may be arranged on the first insulating layer 120, and may cover a portion of the redistribution line pattern 135. For example, the second insulating layer 140 may contact upper and side surfaces of the redistribution line pattern 135 and a surface of the first insulating layer 120. The technical concept of a material of the second insulating layer 140 may be a duplicate of that of the material of the first insulating layer 120, and detailed descriptions thereof are omitted. For example, the material of the first insulating layer 120 may be the same as that of the second insulating layer 140.

The UBM 150 may be arranged on the redistribution pattern 130 and the second insulating layer 140, and may be configured to connect the redistribution pattern 130 to the connection terminal 160. The UBM 150 may include the first UBM portion 153, a second UBM portion 155 extending outward from the first UBM portion 153, and a third UBM portion 157 extending from the second UBM portion 155.

The first UBM portion 153 may be a portion of the UBM 150 that is in contact with the redistribution via pattern 133 and overlaps the insulating hole 120H of the first insulating layer 120 in the vertical direction. In an embodiment, the first UBM portion 153 may be conformally arranged along a surface of the redistribution via pattern 133, and have a shape convexly bent in a direction toward the chip pad 115.

The second UBM portion 155 may include a portion of the UBM 150 that extends outward from the first UBM portion 153, and is in contact with the redistribution line pattern 135. In addition, the second UBM portion 155 may be a portion of the UBM 150 that extends on the redistribution line pattern 135 in the horizontal direction, and is surrounded by an internal surface of the second insulating layer 140. For example, the internal surface of the second insulating layer 140 may contact side surfaces of the second UBM portion 155.

In an embodiment, the second UBM portion 155 may include the second dummy hole 150H formed to penetrate the second UBM portion 155 in the vertical direction. The second dummy hole 150H may include a space that is defined by an internal surface of the second UBM portion 155 and may accommodate a portion of the connection terminal 160.

In an embodiment, the second dummy hole 150H of the second UBM portion 155 may be formed to be spaced apart from the chip pad 115 in the horizontal direction. For example, the second dummy hole 150H may not overlap the chip pad 115 in the vertical direction. In addition, the second dummy hole 150H may overlap the first dummy hole 130H of the redistribution line pattern 135 in the vertical direction. In addition, the second dummy hole 150H may constitute, together with the first dummy hole 130H of the redistribution pattern 130, a dummy hole H_d of the semiconductor package 10. The technical concept of the dummy hole H_d of the semiconductor package 10 is described in detail later with reference to FIGS. 3A through 3D.

In an embodiment, the internal surface of the redistribution line pattern 135 defining the first dummy hole 130H may be coplanar with the internal surface of the second UBM portion 155 defining the second dummy hole 150H.

The third UBM portion 157 may extend outward from the second UBM portion 155, and may be a portion of the UBM 150 arranged on the second insulating layer 140. The third UBM portion 157 may contact surfaces of the second insulating layer 140. The third UBM portion 157 may include a periphery portion of the UBM 150, and a side surface of the third UBM portion 157 may be surrounded by the connection terminal 160. The connection terminal 160 may contact surfaces of the first UBM portion 153, the second UBM portion 155, and the third UBM portion 157.

In an embodiment, the UBM 150 may include a metal such as Cu, Al, W, Ti, Ta, In, Mo, Mn, Co, Sn, Ni, Mg, Re, Be, Ga, and Ru, or an alloy thereof, but is not limited thereto.

In an embodiment, the UBM 150 may be arranged between the connection terminal 160 and the redistribution via pattern 133, and between the connection terminal 160 and the redistribution line pattern 135, and may further include a UBM seed layer (not illustrated) arranged between the third UBM portion 157 and the second insulating layer 140. For example, the UBM seed layer may be formed by performing a physical vapor deposition process, and the first UBM portion 153, the second UBM portion 155, and the third UBM portion 157 may be formed by using a plating process utilizing the UBM seed layer.

The connection terminal 160 may include a terminal of a conductive material arranged on the UBM 150 and connected to the chip pad 115 of the semiconductor chip 100. In an embodiment, the connection terminal 160 may be electrically connected to the plurality of individual devices on the active layer AL of the semiconductor chip 100 via the UBM 150, the redistribution pattern 130, and the chip pad 115.

In an embodiment, the connection terminal 160 may include a solder ball of a metal material including at least any one of Sn, Ag, Cu, and Al.

The connection terminal 160 may include a connection portion 163 and a dummy portion 165. In an embodiment, the connection portion 163 of the connection terminal 160 may include a portion of the connection terminal 160 filling a groove formed by the redistribution via pattern 133 and the first UBM portion 153. In addition, the connection portion 163 of the connection terminal 160 may have a tapered shape in which a cross-sectional area in the horizontal direction is reduced toward the chip pad 115.

In an embodiment, the dummy portion 165 of the connection terminal 160 may be arranged to be spaced apart from the connection portion 163 in the horizontal direction, and may include a portion of the connection terminal 160 filling an internal portion of the dummy hole H_d. For example, the dummy portion 165 may not overlap the connection portion 163 in the vertical direction. In addition, the dummy portion 165 may be in contact with an internal surface of the redistribution line pattern 135 and an internal surface of the second UBM portion 155. The dummy portion 165 of the connection terminal 160 may be arranged in the first dummy hole 130H defined by the internal surface of the redistribution line pattern 135 of the dummy portion 165 and in the second dummy hole 150H defined by the internal surface of the second UBM portion 155, and may be in contact with the redistribution line pattern 135 and the second UBM portion 155. The dummy portion 165 may contact a surface of the first insulating layer 120 exposed by the first dummy hole 130H.

The connection terminal 160 of the semiconductor package 10 according to an embodiment may include the dummy portion 165 filling the dummy hole H_d, and accordingly, the structural reliability of the semiconductor package 10 may be improved.

When the connection terminal 160 of the semiconductor package 10 does not include the dummy portion 165, stress occurring in a fabrication operation of the semiconductor package 10 may concentrate at the connection portion 163 of the connection terminal 160. For example, the stress may concentrate at the redistribution via pattern 133 and the first UBM portion 153, which overlap the connection portion 163 of the connection terminal 160 in the vertical direction. Accordingly, cracks and peeling phenomena may frequently occur at the redistribution via pattern 133 and the first UBM portion 153.

Because the connection terminal 160 of the semiconductor package 10 according to an embodiment further includes the dummy portion 165 arranged outside the connection portion 163, the stress occurring in the fabrication operation of the semiconductor package 10 may be distributed to the dummy portion 165. Accordingly, the cracks and peeling phenomena which occur in the redistribution via pattern 133 and the first UBM portion 153 may be reduced, and thus, the structural reliability thereof may be improved.

In addition, the chip pad 115, the redistribution pattern 130, the UBM 150, and the connection terminal 160 included in the semiconductor package 10 according to an embodiment may overlap each other in the vertical direction. Accordingly, the semiconductor package 10 according to an embodiment may have a short electrical connection path between the chip pad 115 and the connection terminal 160.

FIGS. 3A through 3D are diagrams of portions of the semiconductor package 10 seen in a planar view, according to example embodiments.

Referring to FIGS. 3A through 3D, in a planar view of the semiconductor package 10, a cross-section of the chip pad 115 of the semiconductor chip 100 may have a square shape. In addition, a width 115d of the chip pad 115 in the horizontal direction may be about 35 μm to about 40 μm. However, the shape and width 115d of the chip pad 115 are not limited thereto.

In an embodiment, in a planar view of the semiconductor package 10, the redistribution via pattern 133 and the first UBM portion 153 may be arranged within an area of the chip pad 115. In addition, cross-sections of the redistribution via pattern 133 and the first UBM portion 153 may have a circular shape.

In an embodiment, a width 133d of the redistribution via pattern 133 in the horizontal direction may be greater than a width 153d of the first UBM portion 153 in the horizontal direction, and may be less than a width 115d of the chip pad 115 in the horizontal direction. For example, the width 133d of the redistribution via pattern 133 in the horizontal direction may be about 25 μm to about 33 μm. However, the width 133d of the redistribution via pattern 133 in the horizontal direction is not limited thereto.

As described above, the second UBM portion 155 may extend outward from the first UBM portion 153 and be arranged on the redistribution line pattern 135, and may include a portion of the UBM 150 in which side surfaces thereof are surrounded by a second insulating layer (e.g., second insulating layer 140 in FIG. 1).

In an embodiment, a width 155d of the second UBM portion 155 in the horizontal direction may be greater than the width 115d of the chip pad 115 in the horizontal direction, and may be less than a width 135d of the redistribution line pattern 135 in the horizontal direction. For example, the width 155d of the second UBM portion 155 in the horizontal direction may be about 100 μm to about 200 μm.

As described above, the third UBM portion 157 may extend outward from the second UBM portion 155, and may include a portion of the UBM 150 arranged on the second insulating layer 140. In an embodiment, a width 157d of the third UBM portion 157 in the horizontal direction may be less than the width 135d of the redistribution line pattern 135 in the horizontal direction.

The connection terminal 160 may be formed on the UBM 150 and portions of the second insulating layer 140. In an embodiment, a width 160d of the connection terminal 160 in the horizontal direction may be greater than a width 157d of the third UBM portion 157 in the horizontal direction and less than a width 135d of the redistribution line pattern 135 in the horizontal direction.

The semiconductor package 10 may include dummy holes H_d1, H_d2, H_d3, and H_d4, respectively illustrated in FIGS. 3A to 3D, each penetrating a portion of the redistribution line pattern 135 spaced apart from the chip pad 115 and a portion of the second UBM portion 155 in the vertical direction. For example, the dummy holes H_d1, H_d2, H_d3, and H_d4 may not overlap the chip pad 115 in the vertical direction. The dummy holes H_d1, H_d2, H_d3, and H_d4 may include the first dummy hole 130H of the redistribution line pattern 135 and the second dummy hole 150H of the second UBM portion 155 as described above. In addition, as respectively illustrated in FIGS. 3A to 3D a dummy space provided by the dummy holes H_d1, H_d2, H_d3, and H_d4 of the semiconductor package 10 may be filled by dummy portions 165_H1, 165_H2, 165_H3, and 165_H4 of the connection terminal 160, respectively.

Figure 3A:
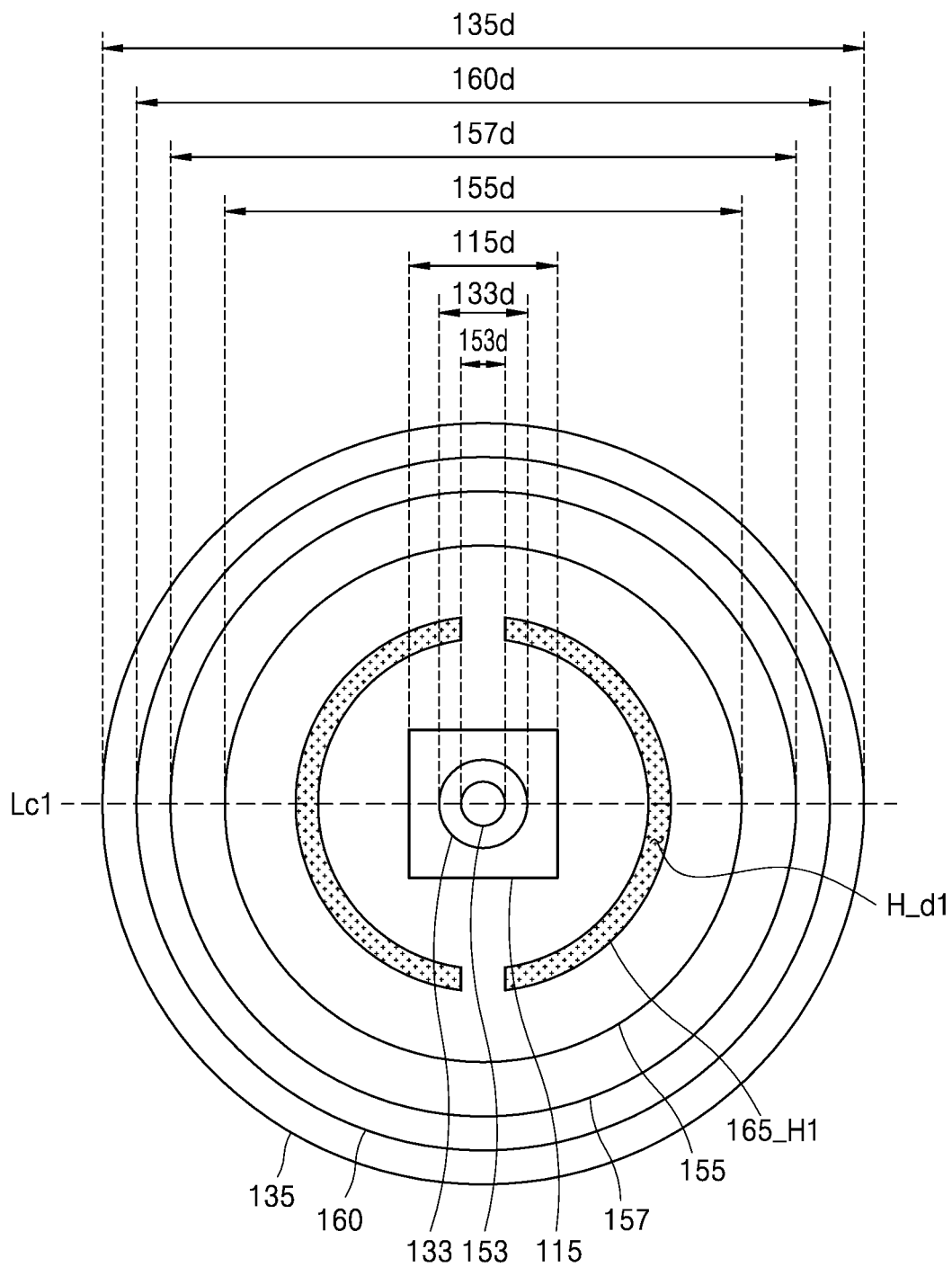
FIGS. 3A through 3D are diagrams of portions of a semiconductor package seen in a planar view, according to example embodiments.

Referring to FIG. 3A, the dummy hole H_d1 of the semiconductor package 10 according to an embodiment may be provided as a plurality of dummy holes H_d1. In an embodiment, in a planar view of the semiconductor package 10, each of the plurality of dummy holes H_d1 may have an arc shape surrounding side surfaces of the chip pad 115. In addition, the plurality of dummy holes H_d1 may be filled by the dummy portions 165_H1 of the connection terminal 160. The dummy portions 165_H1 may correspond to the dummy portions 165 illustrated in FIGS. 1 and 2.

In an embodiment, a plurality of dummy holes H_d1 may be provided as two dummy holes H_d1. For example, one dummy hole H_d1 may surround one side surface of the chip pad 115. In addition, the other dummy hole H_d1 may surround the other side of the chip pad 115 opposite to the one side of the chip pad 115. For example, each of the plurality of dummy holes H_d1 may be in a half-arc shape arranged at an interval of 180 degrees to surround one side surface of the chip pad 115.

In an embodiment, the plurality of dummy holes H_d1 may be arranged to be symmetrical with an imaginary center line Lc1 passing through the center of the chip pad 115 as a reference. Because the plurality of dummy holes H_d1 are arranged to be symmetrical with the imaginary center line Lc1 as a reference, distribution of stress occurring in the fabrication operation of the semiconductor package 10 may be uniform.

Figure 3B:
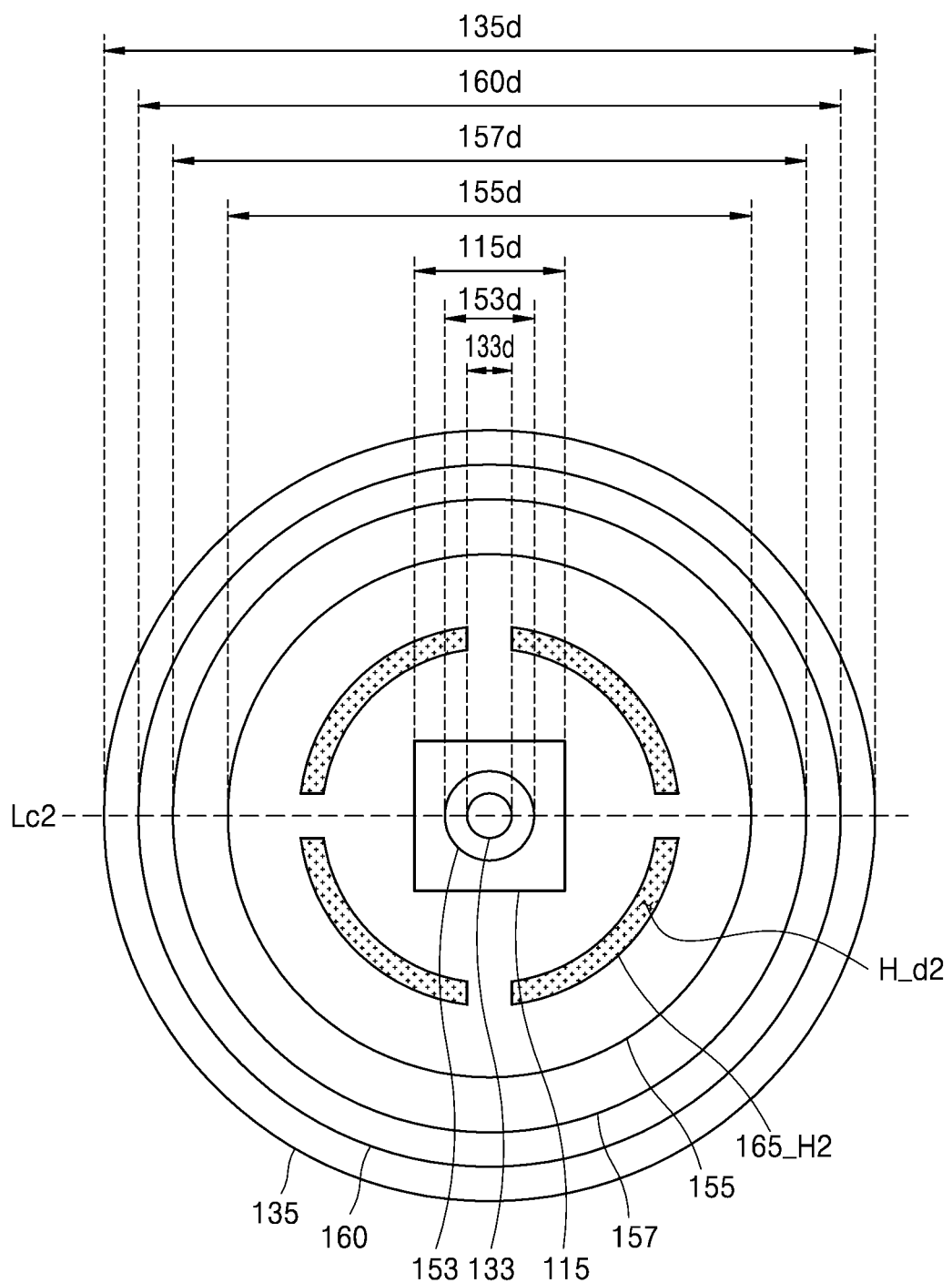

Referring to FIG. 3B, the dummy holes H_d2 of the semiconductor package 10 according to an embodiment may be provided as four dummy holes H_d2. For example, each of the plurality of dummy holes H_d2 may be in a quarter-arc shape arranged at an interval of 90 degrees to surround a respective corner of the chip pad 115.

In addition, the dummy space provided by the plurality of dummy holes H_d2 of the semiconductor package 10 may be filled by dummy portions 165_H2 of the connection terminal 160. The dummy portions 165_H2 may correspond to the dummy portions 165 illustrated in FIGS. 1 and 2. In addition, the plurality of dummy holes H_d2 may be arranged to be symmetrical with an imaginary center line Lc2 passing through the center of the chip pad 115 as a reference.

Figure 3C:
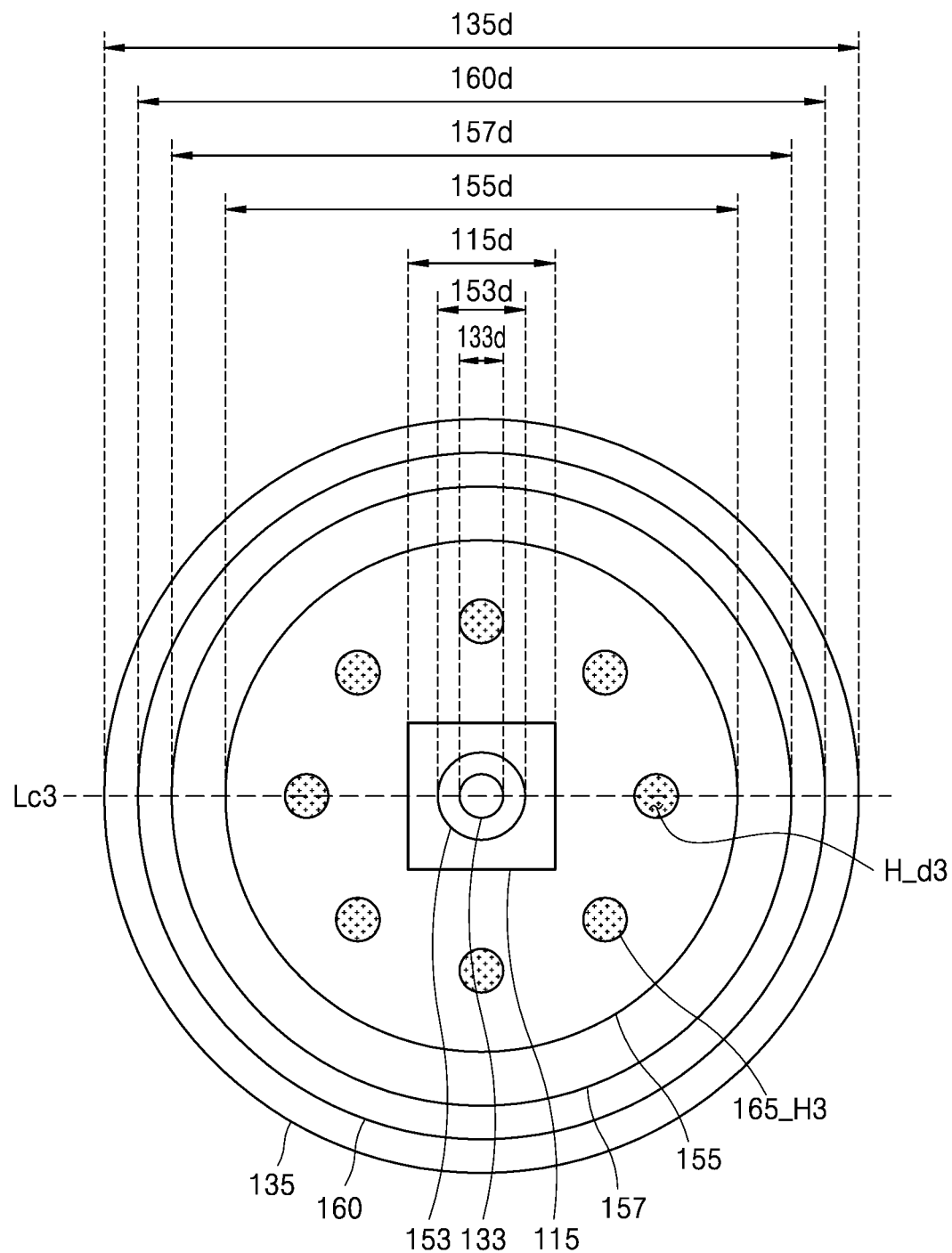

Referring to FIG. 3C, the dummy hole H_d3 of the semiconductor package 10 according to an embodiment may be provided as a plurality of dummy holes H_d3. In a planar view of the semiconductor package 10, the semiconductor package 10 may include a plurality of dummy holes H_d3 arranged to surround the side surface of the chip pad 115. Each of the plurality of dummy holes H_d3 may have a circular shape.

In FIG. 3C, the number of dummy holes H_d3 of the semiconductor package 10 according to an embodiment is illustrated as eight, but is not limited thereto.

In addition, a dummy space provided by the plurality of dummy holes H_d3 of the semiconductor package 10 may be filled by a dummy portion 165_H3 of the connection terminal 160. The dummy portions 165_H3 may correspond to the dummy portions 165 illustrated in FIGS. 1 and 2. In addition, the plurality of dummy holes H_d3 may be arranged to be symmetrical with an imaginary center line Lc3 passing through the center of the chip pad 115 as a reference.

Figure 3D:
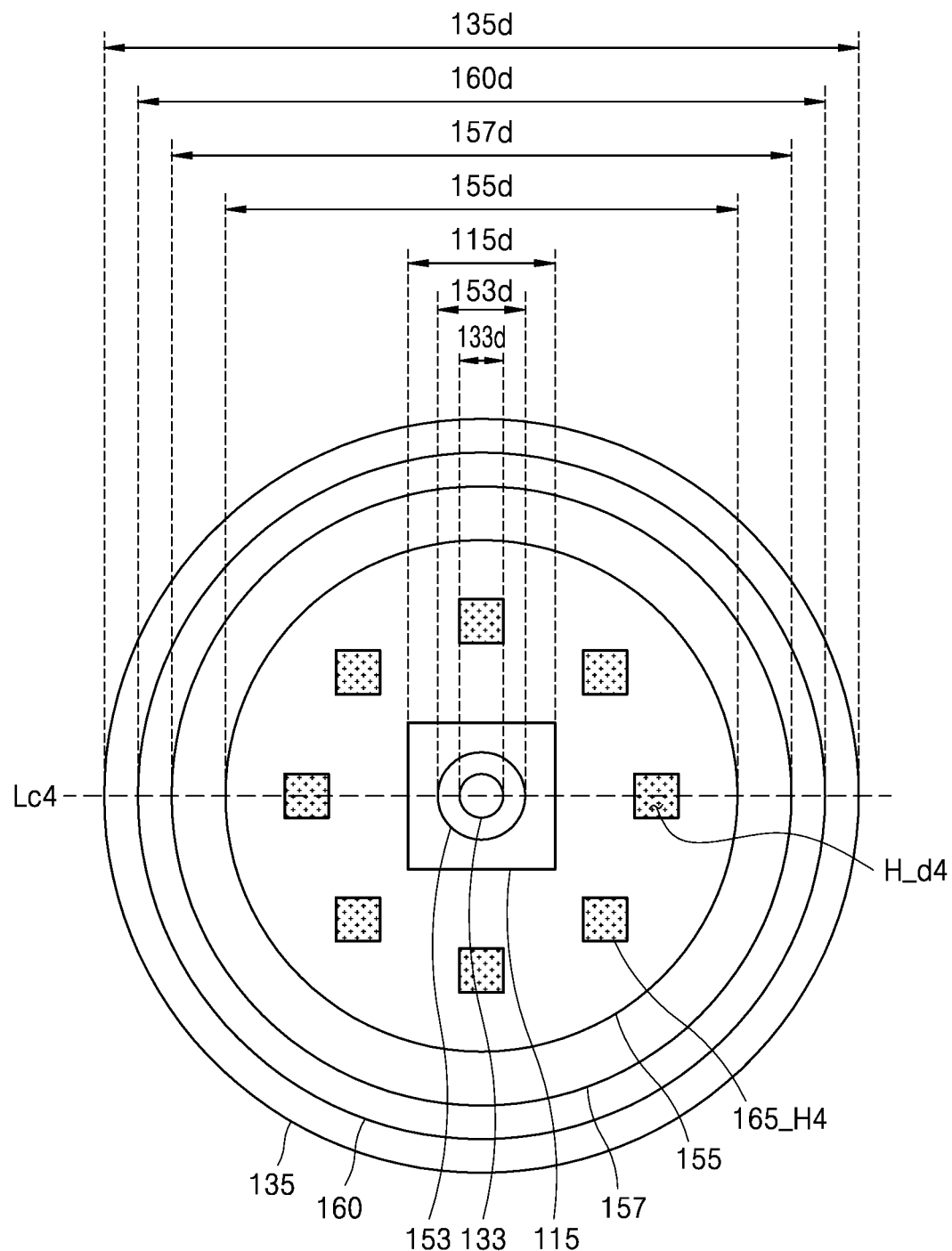

Referring to FIG. 3D, a dummy hole H_d4 of the semiconductor package 10 according to an embodiment may be provided as a plurality of dummy holes H_d4. In a planar view of the semiconductor package 10, the semiconductor package 10 may include a plurality of dummy holes H_d4 arranged to surround the side surface of the chip pad 115. Each of the plurality of dummy holes H_d4 may have a polygonal shape.

In FIG. 3D, the shape of the dummy dole H_d4 of the semiconductor package 10 according to an embodiment is illustrated as rectangular, but the embodiment is not limited thereto, and the shape of the dummy hole H_d3 may include a shape of a polygon such as a triangle, a pentagon, a hexagon, and an octagon.

In addition, a dummy space provided by the plurality of dummy holes H_d4 of the semiconductor package 10 may be filled by dummy portions 165_H4 of the connection terminal 160. The dummy portions 165_H4 may correspond to the dummy portion 165 illustrated in FIGS. 1 and 2. In addition, the plurality of dummy holes H_d4 may be arranged to be symmetrical with an imaginary center line Lc4 passing through the center of the chip pad 115 as a reference.

Figure 4:
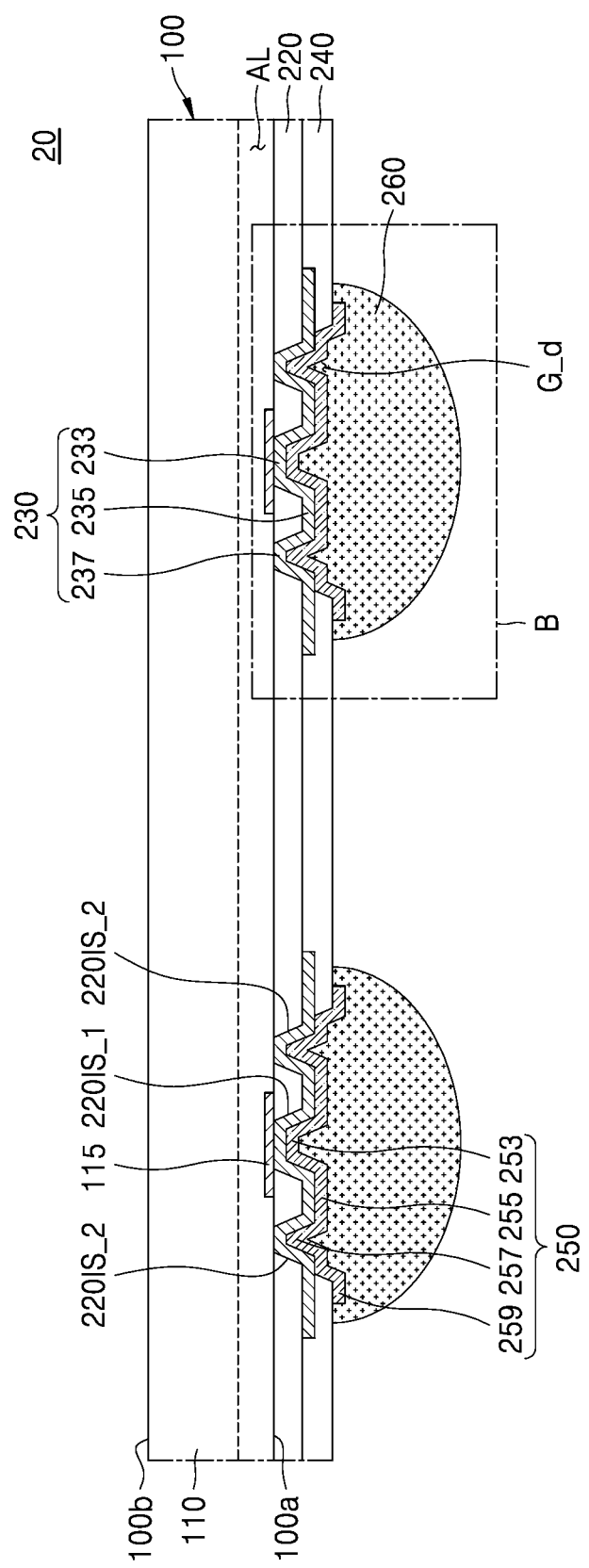
FIG. 4 is a cross-sectional view of a semiconductor package, according to an example embodiment.

FIG. 4 is a cross-sectional view of a semiconductor package 20 according to an embodiment. In addition, FIG. 5 is an enlarged diagram of a region B in FIG. 4.

Figure 5:
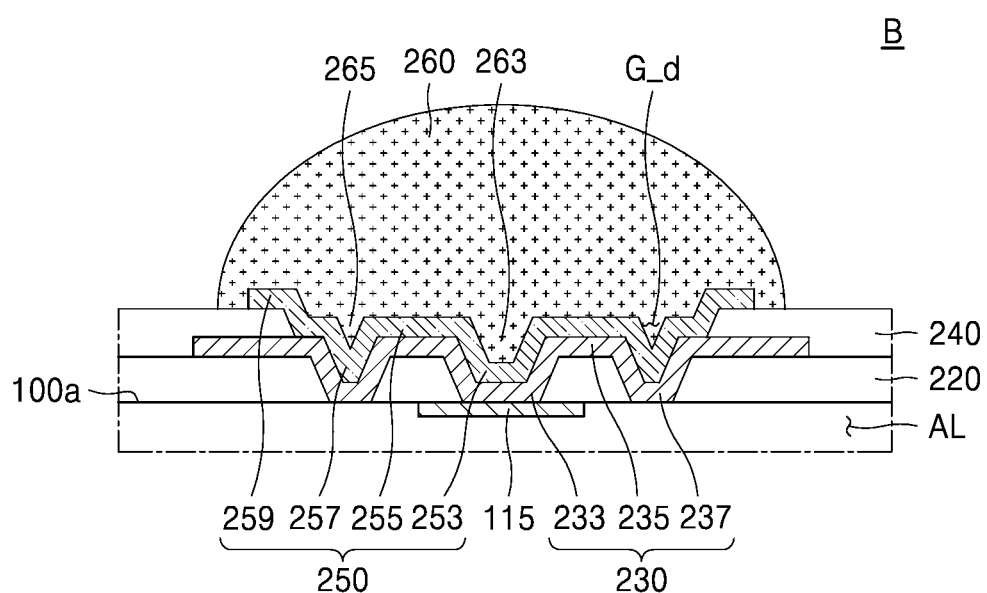
FIG. 5 is an enlarged diagram of a region B in FIG. 4.

Referring to FIGS. 4 and 5 together, the semiconductor package 20 according to an embodiment may include the semiconductor chip 100, a first insulating layer 220, the redistribution pattern 230, a second insulating layer 240, a UBM 250, and a connection terminal 260.

Hereinafter, duplicate descriptions of the semiconductor package 10 given with reference to FIGS. 1 and 2 are omitted and differences are mainly described.

The first insulating layer 220 may include a layer of an insulating material arranged on the first surface 100a of the semiconductor chip 100. The first insulating layer 220 may include a first insulating hole (e.g., first insulating hole 220H_1 in FIG. 11A) exposing the chip pad 115 of the semiconductor chip 100. The first insulating hole 220H_1 may overlap the chip pad 115 in the vertical direction. The first insulating layer 220 may include a first internal surface 220IS_1 defining the first insulating hole 220H_1.

In addition, the first insulating layer 220 may not be formed outside the first insulating hole 220H_1 of the semiconductor chip 100, and may include a second insulating hole 220H_2 that does not overlap the chip pad 115 in the vertical direction. The first insulating layer 220 may include a second internal surface 220IS_2 defining the second insulating hole 220H_2.

The first insulating hole 220H_1 of the first insulating layer 220 may provide a space where a redistribution via pattern 233 of the redistribution pattern 230 and a first UBM portion 253 of the UBM 250 are arranged. In addition, the second insulating hole 220H_2 of the first insulating layer 220 may provide a space where a redistribution dummy pattern 237 of the redistribution pattern 230 and a UBM dummy portion 257 of the UBM 250 are arranged.

In an embodiment, the first insulating hole 220H_1 and the second insulating hole 220H_2 of the first insulating layer 220 may have a tapered shape in which widths in the horizontal direction are reduced toward the first surface 100a of the semiconductor chip 100.

The redistribution pattern 230 may include the redistribution via pattern 233, a redistribution line pattern 235, and the redistribution dummy pattern 237. The redistribution via pattern 233 may include a portion of the redistribution pattern 230 in contact with the chip pad 115 of the semiconductor chip 100. In an embodiment, the redistribution via pattern 233 may be conformally arranged along an internal surface 220IS1 defining the first insulating hole 220H_1 of the first insulating layer 220 and along one surface of the chip pad 115, and may be electrically connected to the chip pad 115. For example, the redistribution via pattern 233 may have a shape convexly bent in a direction toward the chip pad 115.

In addition, the redistribution line pattern 235 may be connected to the redistribution via pattern 233, and may include a portion of the redistribution pattern 230 extending in the horizontal direction on a surface of the first insulating layer 220. In addition, the redistribution line pattern 235 may connect the redistribution via pattern 233 to the redistribution dummy pattern 237 on the surface of the first insulating layer 220.

In addition, the redistribution dummy pattern 237 may be conformally arranged along the second internal surface 220IS 2 defining the second insulating hole 220H_2 of the first insulating layer 220 and along the first surface 100a of the semiconductor chip 100. In addition, the redistribution dummy pattern 237 may be arranged outside the redistribution via pattern 233, and may have a shape convexly bent in a direction toward the first surface 100a of the semiconductor chip 100.

In an embodiment, the redistribution dummy pattern 237 may provide a dummy groove G_d having a shape protruding in a direction toward the first surface 100a of the semiconductor chip 100, together with the UBM dummy portion 257 of the UBM 250 arranged on the redistribution dummy pattern 237. A dummy space formed by the dummy groove G_d may be filled by the connection terminal 260.

In example embodiments, the redistribution pattern 230, including the redistribution via pattern 233, the redistribution line pattern 235, and the redistribution dummy pattern 237, may be a homogeneous monolithic structure. For example, the redistribution via pattern 233, the redistribution line pattern 235, and the redistribution dummy pattern 237 may be formed at the same time and of the same material, without a break in the continuity of the material of which they are formed.

The second insulating layer 240 may be arranged on the first insulating layer 220, and may include a layer of an insulating material covering a portion of the redistribution pattern 230. The second insulating layer 240 may be arranged on the first insulating layer 220, and may cover a portion of the redistribution line pattern 235.

The UBM 250 may be arranged on the redistribution pattern 230 and the second insulating layer 240, and may be configured to connect the redistribution pattern 230 to the connection terminal 260. The UBM 250 may include a first UBM portion 253 arranged on the redistribution via pattern 233, a second UBM portion 255 extending outside from the first UBM portion 253 and arranged on the redistribution line pattern 235, the UBM dummy portion 257 extending outward from the second UBM portion 255 and arranged on the redistribution dummy pattern 237, and a third UBM portion 259 extending outward from the second UBM portion 255 and arranged on the second insulating layer 240. In example embodiments, the UBM 250, including the first UBM portion 253, the second UBM portion 255, the UBM dummy portion 257, and the third UBM portion 259, may be a homogeneous monolithic structure. For example, the first UBM portion 253, the second UBM portion 255, the UBM dummy portion 257, and the third UBM portion 259 may be formed at the same time and of the same material, without a break in the continuity of the material of which they are formed.

The first UBM portion 253 may be in contact with the redistribution via pattern 233, and may include a portion of the UBM 250 overlapping the first insulating hole 220H_1 of the first insulating layer 220 in the vertical direction. In an embodiment, the first UBM portion 253 may be conformally arranged along a surface of the redistribution via pattern 233, and have a shape convexly bent in a direction toward the chip pad 115.

In an embodiment, the first UBM portion 253 may, due to a shape thereof, provide a groove having a shape protruding in a direction toward the chip pad 115 of the semiconductor chip 100, together with the redistribution via pattern 233. The groove may be filled by a connection portion 263.

The second UBM portion 255 may include a portion of the UBM 250 that extends outward from the first UBM portion 253 and contacts the redistribution line pattern 235. In addition, the second UBM portion 255 may be a portion of the UBM 250 that extends on the redistribution line pattern 235 in the horizontal direction, and is surrounded by the second insulating layer 240.

The UBM dummy portion 257 may extend outward from the second UBM portion 255, and may include a portion of the UBM 250 in contact with the redistribution dummy pattern 237. In addition, the UBM dummy portion 257 may include a portion of the UBM 250 overlapping the second insulating hole 220H_2 in the vertical direction.

In an embodiment, the UBM dummy portion 257 may be conformally arranged along a surface of the redistribution dummy pattern 237, and have a shape convexly bent in a direction toward the first surface 100a of the semiconductor chip 100. In addition, the UBM dummy portion 257 may be formed to be spaced apart from the chip pad 115 in the horizontal direction. For example, the UBM dummy portion 257 may not overlap the chip pad 115 in the vertical direction.

The UBM dummy portion 257 may, due to the shape thereof described above, provide the dummy groove G_d having a shape protruding in a direction toward the first surface 100a of the semiconductor chip 100, together with the redistribution dummy pattern 237. The dummy groove G_d may be defined by an internal surface of the UBM dummy portion 257, and provide a dummy space accommodating a portion of the connection terminal 260 spaced apart from the chip pad 115 in the horizontal direction. For example, the dummy groove G_d may accommodate a dummy portion 265 of the connection terminal 260, and the dummy groove G_d and the dummy portion 265 may not overlap the chip pad 115 in the vertical direction.

The third UBM portion 259 may extend outward from the second UBM portion 255, and may be arranged on the second insulating layer 240. In an embodiment, a side portion of the third UBM portion 259 may be surrounded by the connection terminal 260.

The connection terminal 260 may include a terminal of a conductive material that is arranged on the UBM 250 and connected to the chip pad 115 of the semiconductor chip 100. The connection terminal 260 may include the connection portion 263 and the dummy portion 265.

The connection portion 263 of the connection terminal 260 may include a portion of the connection terminal 260 filling a groove formed by the redistribution via pattern 233 and the first UBM portion 253. In addition, the connection portion 263 of the connection terminal 260 may have a tapered shape in which a cross-sectional area in the horizontal direction is reduced toward the chip pad 115.

In an embodiment, a dummy portion 265 of the connection terminal 260 may be arranged to be spaced apart from the connection portion 263 in the horizontal direction, and may include a portion of the connection terminal 260 filling an internal portion of the dummy groove G_d. For example, the dummy portion 265 may not overlap the connection portion 263 in the vertical direction. In addition, the dummy portion 265 may be in contact with the internal surface of the UBM dummy portion 257.

In an embodiment, the dummy portion 265 of the connection terminal 260 may be arranged inside the dummy groove G_d defined by the internal surface of the UBM dummy portion 257, and may be surrounded by the UBM dummy portion 257.

In an embodiment, the dummy portion 265 of the connection terminal 260 may be surrounded by the internal surface of the UBM dummy portion 257, the UBM dummy portion 257 may be surrounded by an internal surface of the redistribution dummy pattern 237, and the redistribution dummy pattern 237 may be surrounded by the internal surface of the first insulating layer 220.

Because the connection terminal 260 of the semiconductor package 20 according to an embodiment further includes the dummy portion 265 arranged outside the connection portion 263, the stress occurring in the fabrication operation of the semiconductor package 20 may be distributed to the dummy portion 265. For example, the stress may not concentrate at the connection portion 263 of the connection terminal 260, but may be distributed to the dummy portion 265.

Figure 6A:
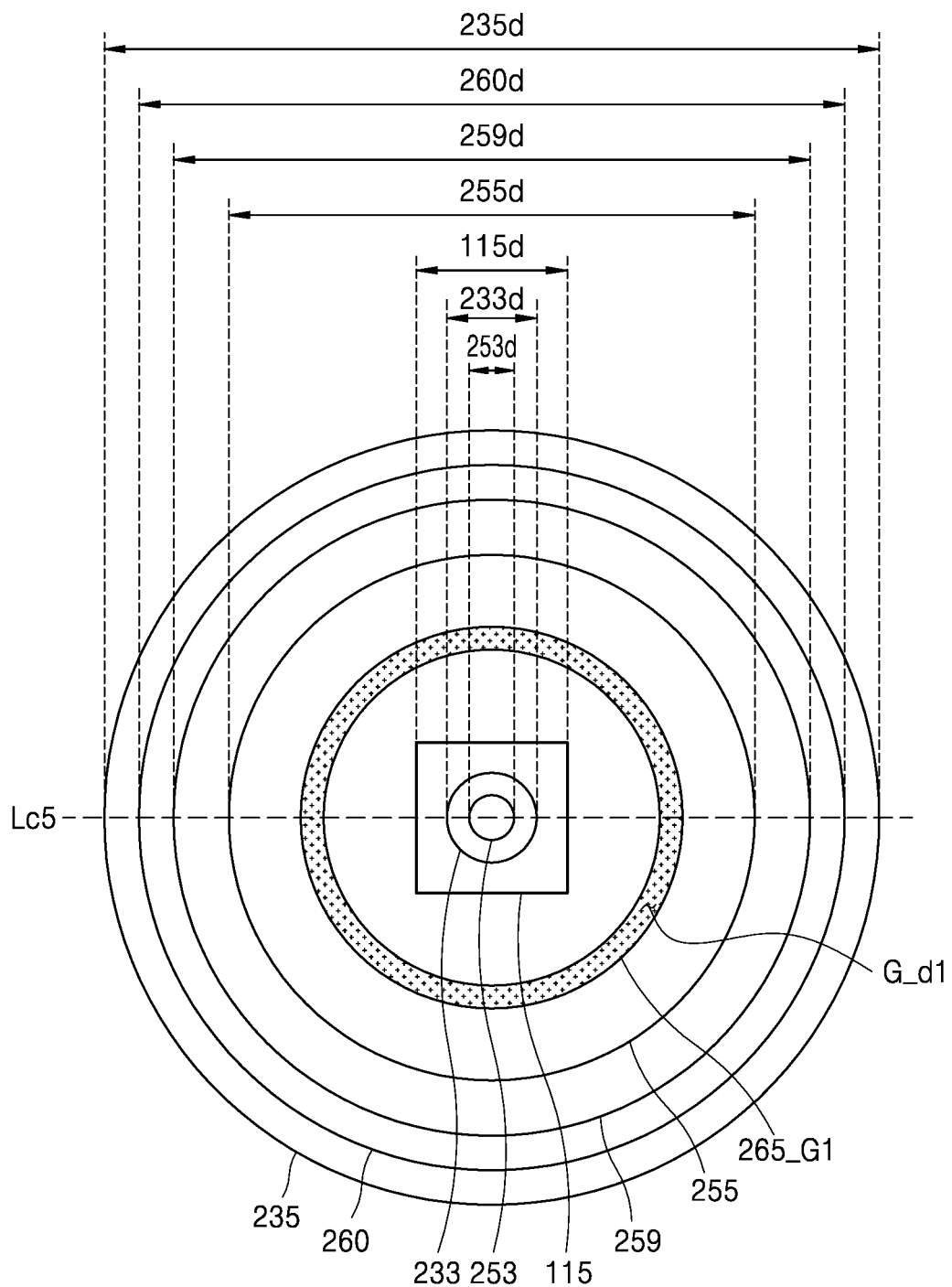
FIGS. 6A through 6C are diagrams of portions of a semiconductor package seen in a planar view, according to example embodiments.
Figure 6B:
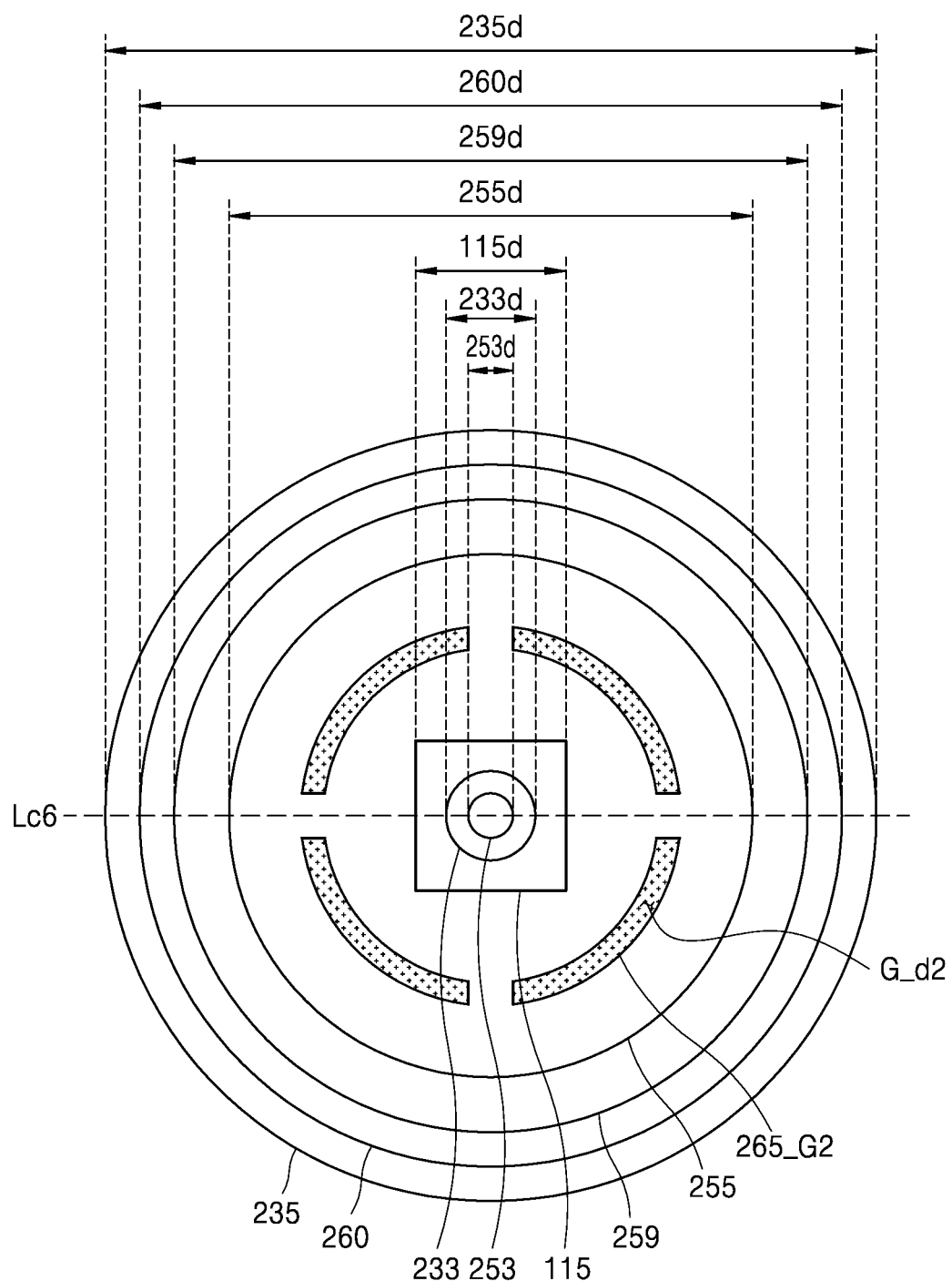
Figure 6C:
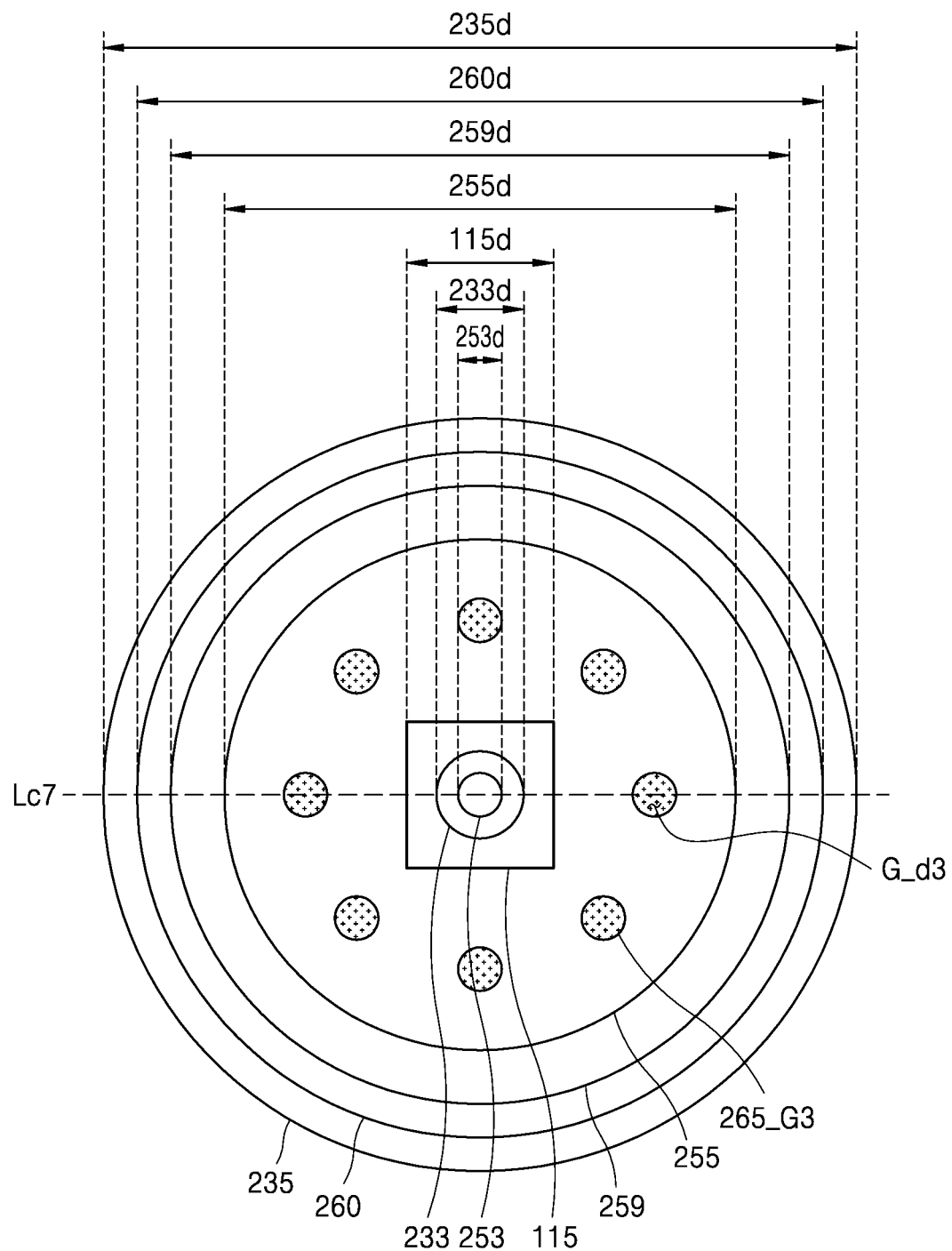

FIGS. 6A through 6C are diagrams of portions of the semiconductor package 20 seen in a planar view, according to example embodiments.

In an example embodiment, in a planar view of the semiconductor package 20, the redistribution via pattern 233 and the first UBM portion 253 may be arranged within a perimeter of the chip pad 115. In addition, cross-sections of the redistribution via pattern 233 and the first UBM portion 253 may have a circular shape.

In an embodiment, a width 233$d$ of the redistribution via pattern 233 in the horizontal direction may be greater than a width 253$d$ of the first UBM portion 253 in the horizontal direction, and may be less than a width 215$d$ of the chip pad 215 in the horizontal direction. For example, the width 233$d$ of the redistribution via pattern 233 in the horizontal direction may be about 25 μm to about 33 μm. However, the width 233$d$ of the redistribution via pattern 233 in the horizontal direction is not limited thereto.

In an embodiment, a width 255$d$ of the second UBM portion 255 in the horizontal direction may be greater than the width 215$d$ of the chip pad 215 in the horizontal direction, and may be less than a width 235$d$ of the redistribution line pattern 235 in the horizontal direction. For example, the width 255$d$ of the second UBM portion 255 in the horizontal direction may be about 100 μm to about 200 μm. However, the width 233$d$ of the second UBM portion 255 in the horizontal direction is not limited thereto.

In an embodiment, a width 259$d$ of the third UBM portion 259 in the horizontal direction may be less than the width 235$d$ of the redistribution line pattern 235 in the horizontal direction. In an embodiment, a width 260$d$ of the connection terminal 260 in the horizontal direction may be greater than a width 259$d$ of the third UBM portion 259 in the horizontal direction and less than a width 235$d$ of the redistribution line pattern 235 in the horizontal direction.

Referring to FIGS. 6A through 6C, in a planar view of the semiconductor package 20, the semiconductor package 20 may include dummy grooves G_d1, G_d2, and G_d3, respectively, formed by the redistribution dummy pattern 237 and the UBM dummy portion 257 to be spaced apart from the chip pad 115 in the horizontal direction. For example, the dummy grooves G_d1, G_d2, and G_d3 may not overlap the chip pad 115 in the vertical direction. In addition, dummy spaces provided by the dummy grooves G_d1, G_d2, and G_d3 may be filled by dummy portions 265_G1, 265_G2, and 265_G3 of the connection terminal 260, respectively, in FIGS. 6A through 6C.

Referring to FIG. 6A, the dummy groove G_d1 of the semiconductor package 20 according to an example embodiment may be provided in a ring shape. In an embodiment, when the semiconductor package 20 is seen in a planar view, the dummy groove G_d1 may have a ring shape surrounding side surfaces of the chip pad 115.

In addition, when the dummy groove G_d1 has a ring shape, the center of the dummy groove G_d1 of the ring shape may coincide with the center of the chip pad 115. For example, the dummy groove G_d1 may have a shape which is symmetrical with an imaginary center line Lc5 passing through the center of the chip pad 115 as a reference. The dummy portion 265_G1 may fill the dummy groove G_d1. The dummy portion 265_G1 may correspond to the dummy portion 265 illustrated in FIG. 5.

Referring to FIG. 6B, the dummy groove G_d2 of the semiconductor package 20 according to an example embodiment may be provided as a plurality of dummy grooves G_d2. For example, a plurality of dummy grooves G_d2 may be provided as four dummy grooves G_d2, and each of the plurality of dummy grooves G_d2 may be in a quarter-arc shape arranged at an interval of 90 degrees to surround a respective corner of the chip pad 115. However, the embodiment is not limited thereto, and the plurality of dummy grooves G_d2 may be provided in two, and each of the plurality of dummy grooves G_d2 may be in a half-arc shape arranged at an interval of 180 degrees to surround the side surface of the chip pad 115. In addition, the plurality of dummy grooves G_d2 may be arranged to be symmetrical with an imaginary center line Lc6 passing through the center of the chip pad 115 as a reference. The dummy portions 265_G2 may fill the dummy grooves G_d2. The dummy portions 265_G2 may correspond to the dummy portion 265 illustrated in FIG. 5.

Referring to FIG. 6C, the dummy groove G_d3 of the semiconductor package 20 according to an example embodiment may be provided as a plurality of dummy grooves G_d3. In a planar view of the semiconductor package 20, the semiconductor package 20 may include a plurality of dummy grooves G_d3 arranged to surround the side surface of the chip pad 115. Each of the plurality of dummy grooves G_d3 may have a circular shape.

However, the embodiment is not limited thereto, and the shape of the plurality of dummy grooves G_d3 may include a shape of a polygon such as a triangle, a square or rectangle, a pentagon, a hexagon, and an octagon. In addition, the number of dummy grooves G_d3 is illustrated as eight, but is not limited thereto. In addition, the plurality of dummy grooves G_d3 may be arranged to be symmetrical with an imaginary center line Lc7 passing through the center of the chip pad 115 as a reference. The dummy portions 265_G3 may fill the dummy grooves G_d3. The dummy portions 265_G3 may correspond to the dummy portion 265 illustrated in FIG. 5.

Figure 7:
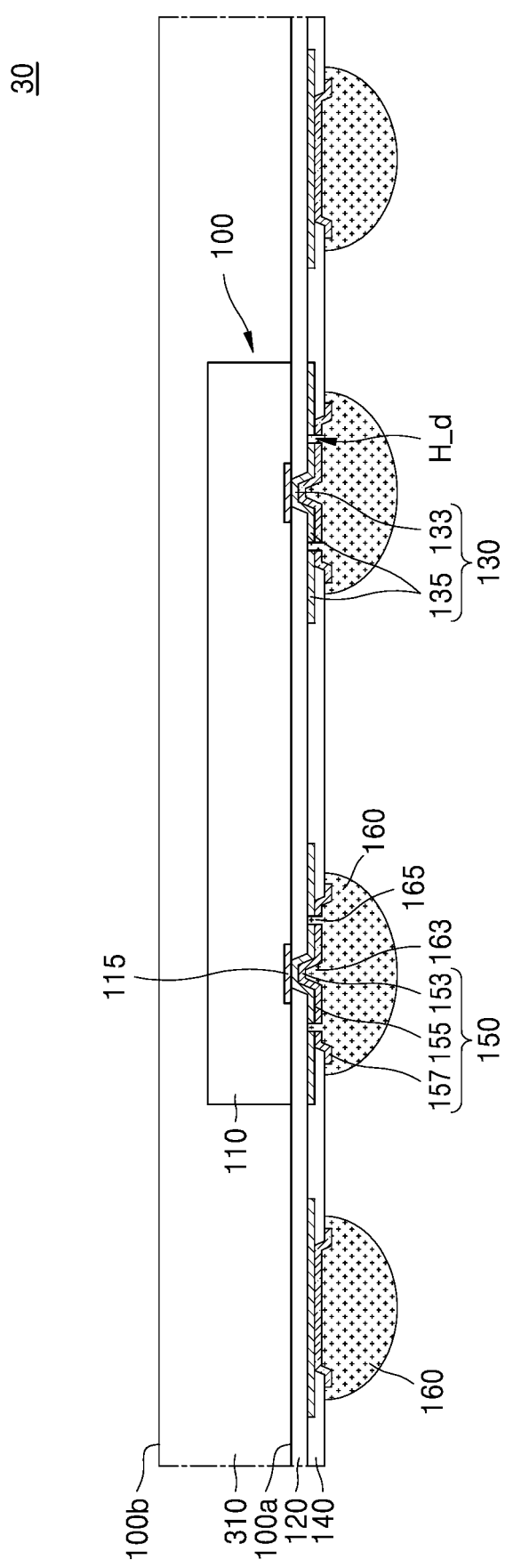
FIG. 7 is a cross-sectional view of a semiconductor package, according to an example embodiment.

FIG. 7 is a cross-sectional view of a semiconductor package 30 according to an example embodiment.

Referring to FIG. 7, the semiconductor package 30 according to an embodiment may include the semiconductor chip 100, the first insulating layer 120, the redistribution pattern 130, the second insulating layer 140, the UBM 150, and a molding layer 310. Hereinafter, duplicate descriptions of the semiconductor package 10 and the semiconductor package 30 given with reference to FIGS. 1 and 7, respectively, are omitted and differences are mainly described.

The semiconductor package 30 according to an embodiment may include a semiconductor package having a fan-out structure in which at least one of a plurality of connection terminals 160 is arranged outward from the side surface of the semiconductor chip 100. For example, the semiconductor package 30 may include a fan-out wafer level package (FO-WLP).

In an embodiment, the redistribution pattern 130 and the UBM 150 overlapping the semiconductor chip 100 in the vertical direction may form the dummy hole H_d described above with reference to FIGS. 1 through 3D. The redistribution pattern 130 and the UBM 150 arranged to be spaced apart from the side surface of the semiconductor chip 100 in the horizontal direction may not form the dummy hole H_d.

The molding layer 310 may include a layer surrounding the semiconductor chip 100 on the first insulating layer 120. In addition, the molding layer 310 may include a layer configured to fix the semiconductor chip 100 on the first insulating layer 120.

In an embodiment, the molding layer 310 may surround the second surface 100b and the side surface of the semiconductor chip 100 on the first insulating layer 120. However, unlike as illustrated in FIG. 7, the molding layer 310 may surround only the side surface of the semiconductor chip 100, and may not surround the second surface 100b of the semiconductor chip 100.

The molding layer 310 may include a material of epoxy mold compound (EMC). However, the embodiment is not limited thereto, and the molding layer 310 may include various materials, for example, an epoxy material, a thermosetting material, a thermoplastic material, a UV-treated material, etc.

Because the semiconductor package 30 according to an embodiment includes the redistribution pattern 130 and the UBM 150 forming the dummy hole H_d, and includes the connection terminal 160 filing the dummy hole H_d, the stress occurring in the fabrication operation of the semiconductor package 30 may not concentrate at the connection portion 163, but may be distributed to the dummy portion 165.

Figure 8:
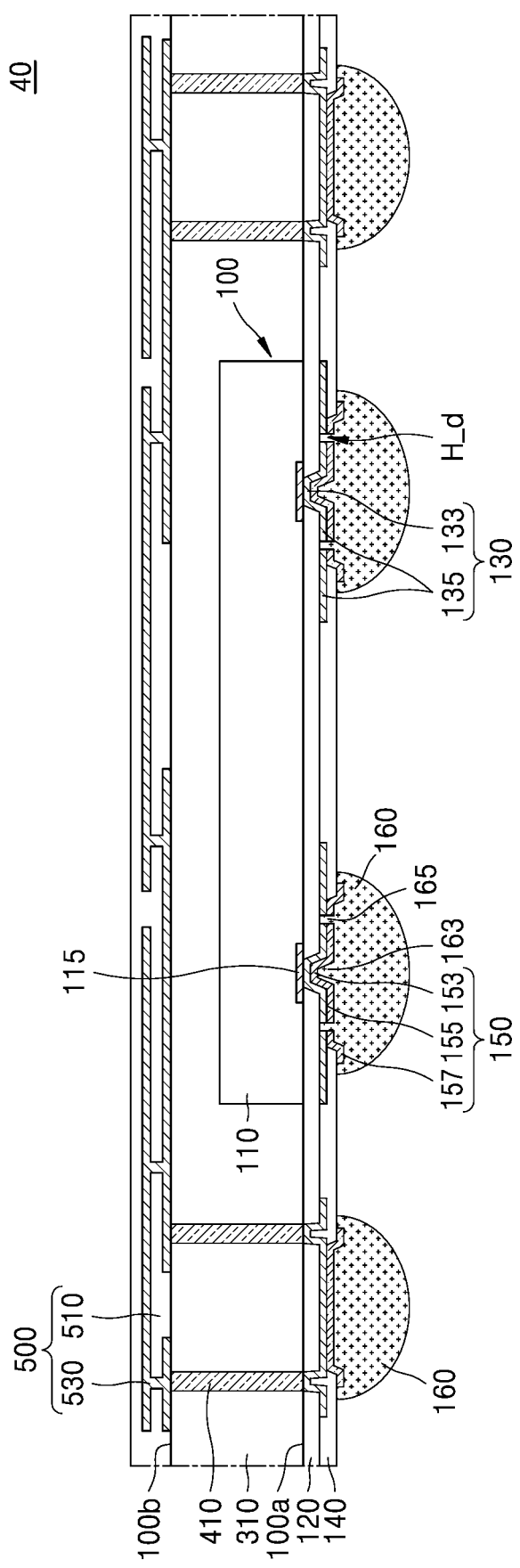
FIG. 8 is a cross-sectional view of a semiconductor package, according to an example embodiment.

FIG. 8 is a cross-sectional view of a semiconductor package 40 according to an example embodiment. Hereinafter, duplicate descriptions of the semiconductor package 30 and the semiconductor package 40 given with reference to FIGS. 7 and 8, respectively, are omitted and differences are mainly described.

The semiconductor package 40 according to an embodiment may include a lower semiconductor package constituting a semiconductor package of a package on package (PoP) type including the lower semiconductor package and an upper semiconductor package.

The semiconductor package 40 may include the semiconductor chip 100, the first insulating layer 120, the redistribution pattern 130, the second insulating layer 140, the UBM 150, the connection terminal 160, the molding layer 310, a conductive post 410, and an upper redistribution structure 500.

The conductive post 410 may include a post including a conductive material arranged to be spaced apart from the semiconductor chip 100. For example, the conductive post 410 may not overlap the semiconductor chip 100 in the vertical direction. In an embodiment, the conductive post 410 may be arranged in a honeycomb or zig-zag shape on the first insulating layer 120.

In an embodiment, one end of the conductive post 410 may be electrically connected to a portion of the redistribution pattern 130, and the other end thereof may be electrically connected to an upper redistribution pattern 530 of the upper redistribution structure 500.

The upper redistribution structure 500 may include a structure to electrically connect the upper semiconductor package mounted on the semiconductor package 40. The upper redistribution structure 500 may include an upper redistribution insulating layer 510 mounted on the molding layer 310, and the upper redistribution pattern 530 extending in the upper redistribution insulating layer 510 and connected to the conductive post 410.

Figure 9:
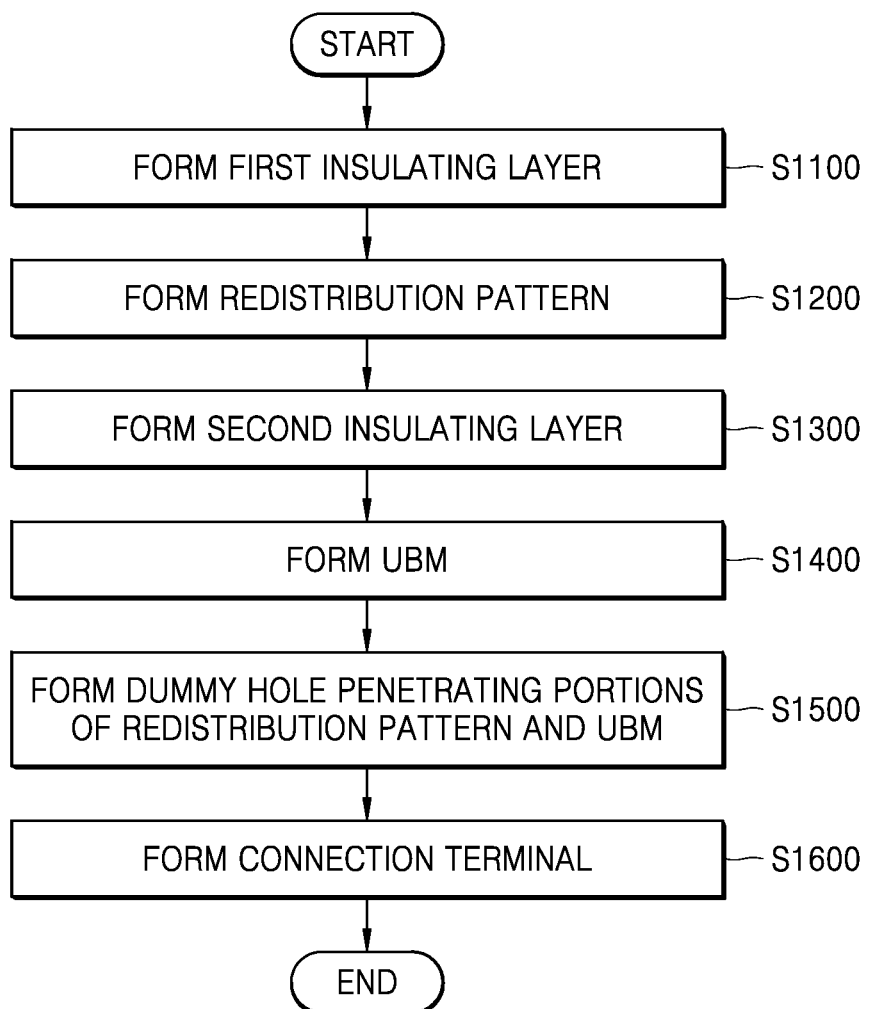
FIG. 9 is a flowchart of a fabrication method of a semiconductor package, according to an example embodiment.

FIG. 9 is a flowchart of a fabrication method of the semiconductor package 10, according to an example embodiment. FIGS. 10A through 10G are diagrams illustrating operations of a fabrication method of the semiconductor package 10, according to example embodiments.

Referring to FIG. 9, the fabrication method of the semiconductor package 10 according to an embodiment may include forming the first insulating layer 120 (S1100), forming the redistribution pattern 130 (S1200), forming the second insulating layer 140 (S1300), forming the UBM 150 (S1400), forming the dummy hole H_d penetrating portions of the redistribution pattern 130 and the UBM 150 (S1500), and forming the connection terminal 160 (S1600).

Figure 10A:
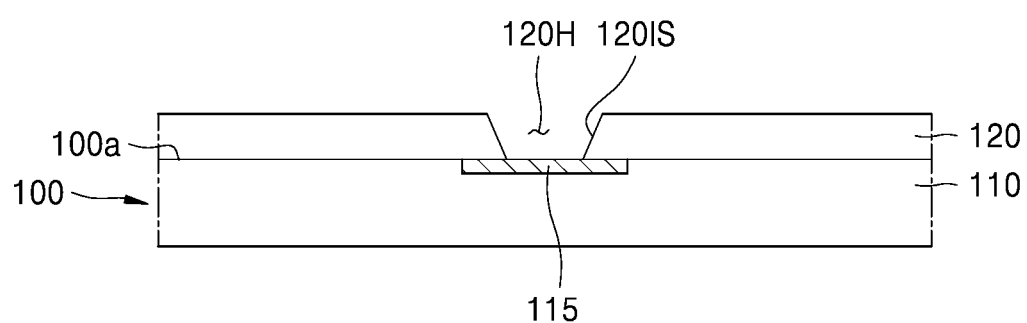
FIGS. 10A through 10G are diagrams illustrating operations of a fabrication method of a semiconductor package, according to example embodiments.

Referring to FIGS. 9 and 10A together, the fabrication method of the semiconductor package 10 according to an embodiment may include the forming of the first insulating layer 120 including the insulating hole 120H (S1100).

Operation S1100 may include doping the first insulating layer 120 on the first surface 100a of the semiconductor chip 100, and forming the insulating hole 120H exposing the chip pad 115 through the first insulating layer 120. The internal surface 120IS of the first insulating layer 120 may define the insulating hole 120H.

In an embodiment, the first insulating layer 120 may be doped at a uniform thickness on the first surface 100a of the semiconductor chip 100 by using a spin coating process.

In an embodiment, the insulating hole 120H exposing the chip pad 115 may be formed by using a general photolithography process and etching process. However, the embodiment is not limited thereto, and the insulating hole 120H may be formed by using a laser drilling process.

Figure 10B:
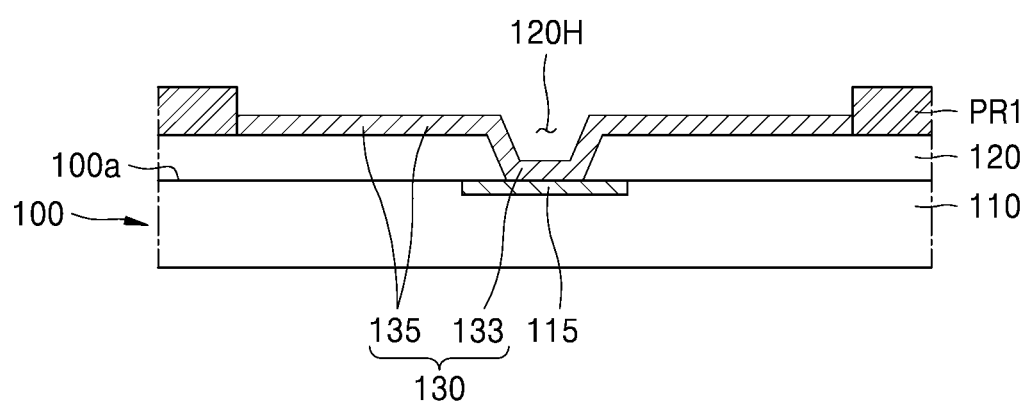

Referring to FIGS. 9 and 10B together, the fabrication method of the semiconductor package 10 according to an embodiment may include the forming of the redistribution pattern 130 (S1200).

Operation S1200 may include forming the redistribution seed layer (not illustrated) on the first insulating layer 120, doping a first photolithography material layer PR1 on the first insulating layer 120 and patterning the first photolithography material layer PR1, and forming the redistribution via pattern 133 and the redistribution line pattern 135.

In an embodiment, the redistribution seed layer (not illustrated) may be conformally formed along the surfaces of the first insulating layer 120 exposed by the first photolithography material layer PR1. For example, the redistribution seed layer may be formed on the surfaces of the first insulating layer 120 by using a physical vapor deposition process.

In addition, in an embodiment, the first photolithography material layer PR1 may be doped on the first insulating layer 120 by using the spin coating process. The first photolithography material layer PR1 may include pattern holes for arranging the redistribution pattern 130 by using an exposure process and a development process.

In an embodiment, the forming of the redistribution via pattern 133 and the redistribution line pattern 135 may include forming the redistribution via pattern 133 and the redistribution line pattern 135 by using a plating process utilizing the redistribution seed layer exposed by the first photolithography material layer PR1.

In an embodiment, the redistribution via pattern 133 may be conformally formed along the internal surface 12015 defining the insulating hole 120H of the first insulating layer 120 and along one surface of the chip pad 115. Accordingly, the redistribution via pattern 133 may have a shape convexly bent in a direction toward the chip pad 115.

In addition, in an embodiment, the redistribution line pattern 135 may be formed to extend on the surface of the first insulating layer 120 in the horizontal direction. In addition, after the forming of the redistribution via pattern 133 and the redistribution line pattern 135 is performed, an operation of removing the first photolithography material layer PR1 may be performed.

Figure 10C:
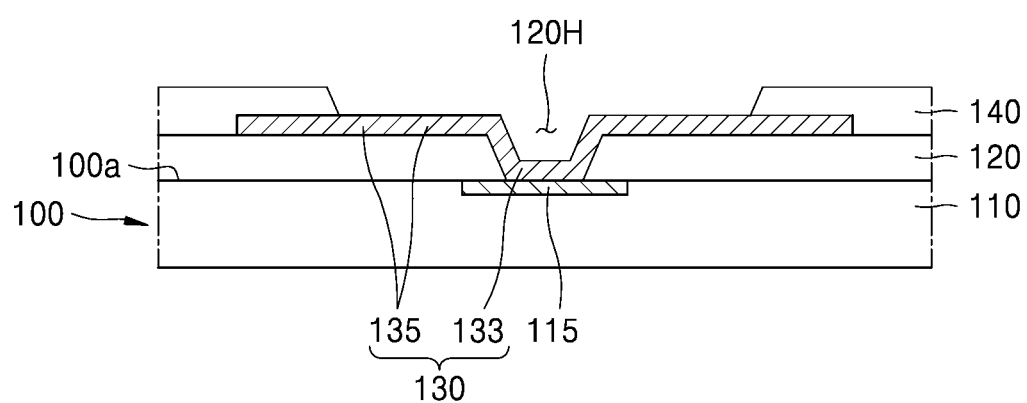

Referring to FIGS. 9 and 10C together, the fabrication method of the semiconductor package 10 according to an embodiment may include the forming of the second insulating layer 140 on the first insulating layer 120 (S1300).

In an embodiment, the second insulating layer 140 may be doped on the first insulating layer 120 at a uniform thickness by using a spin coating process. In addition, a portion of the second insulating layer 140 may be removed by using a photolithography process and an etching process. Accordingly, portions of the redistribution via pattern 133 and the redistribution line pattern 135 may be exposed to the second insulating layer 140.

Figure 10D:
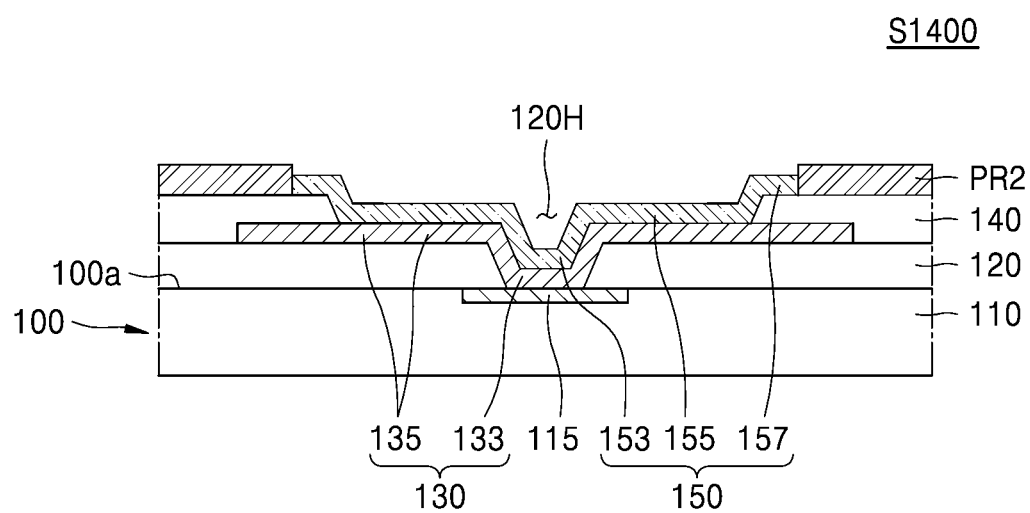

Referring to FIGS. 9 and 10D together, the fabrication method of the semiconductor package 10 according to an embodiment may include the forming of the UBM 150 (S1400).

Operation S1400 may include forming the UBM seed layer (not illustrated) on the second insulating layer 140, doping a second photolithography material layer PR2 on the second insulating layer 140 and patterning the second photolithography material layer PR2, and forming first, second, and third UBM portions 153, 155, and 157.

In an embodiment, the UBM seed layer (not illustrated) may be conformally formed along the surface of the redistribution pattern 130 exposed by the second insulating layer 140 and the second insulating layer 140. For example, the UBM seed layer may be formed on the surfaces of the second insulating layer 140 and the redistribution pattern 130 by using a physical vapor deposition process.

In addition, in an embodiment, the second photolithography material layer PR2 may be doped on the second insulating layer 140 by using a spin coating process. The second photolithography material layer PR2 may include pattern holes for arranging the UBM 150 by using an exposure process and a development process.

In an embodiment, the forming of the first, second, and third UBM portions 153, 155, and 157 may include forming the first, second, and third UBM portions 153, 155, and 157 by using a plating process utilizing the UBM seed layer exposed by the second photolithography material layer PR2.

In an embodiment, the first UBM portion 153 may be conformally formed along the surface of the redistribution via pattern 133. Accordingly, the first UBM portion 153 may have a shape convexly bent in a direction toward the chip pad 115.

In an embodiment, the second UBM portion 155 may be conformally formed along a surface of the redistribution line pattern 135. The second UBM portion 155 may extend from the outside of the first UBM portion 153, and may be arranged on the redistribution line pattern 135.

In an embodiment, the third UBM portion 157 may be conformally formed along a surface of the second insulating layer 140 exposed by the second photolithography material layer PR2. The third UBM portion 157 may extend from the outside of the second UBM portion 155, and may be arranged on the second insulating layer 140.

In addition, after an operation of forming the first, second, and third UBM portions 153, 155, and 157 is performed, an operation of removing the second photolithography material layer PR2 may be performed.

Figure 10E:
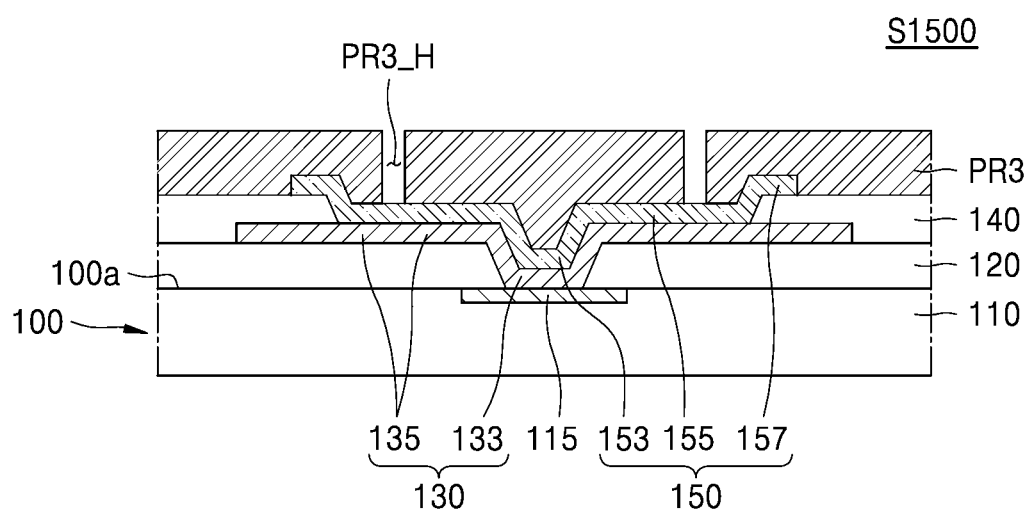
Figure 10F:
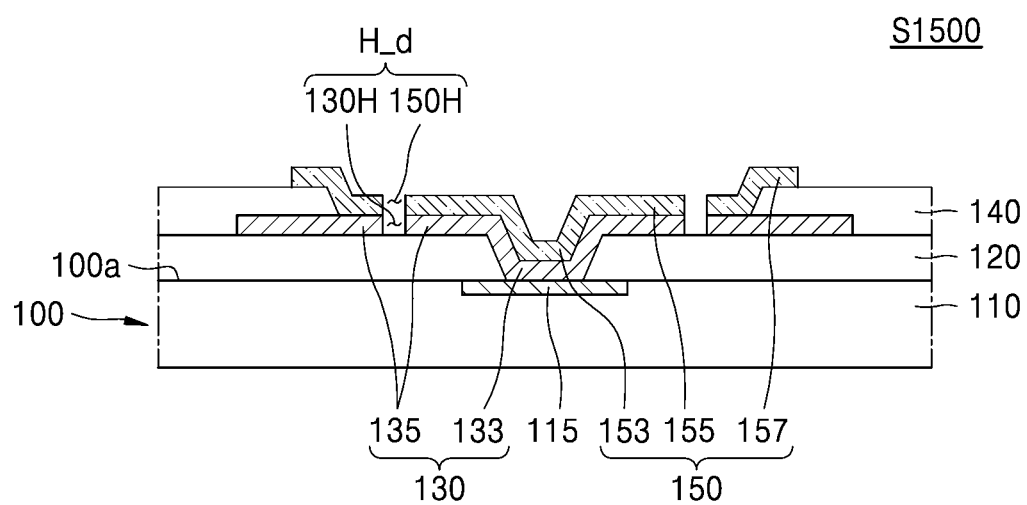

Referring to FIGS. 9, 10E, and 10F together, the fabrication method of the semiconductor package 10 according to an embodiment may include the forming of the dummy hole H_d penetrating portions of the redistribution pattern 130 and the UBM 150 (S1500).

Operation S1500 may include doping and patterning a third photolithography material layer PR3, forming the dummy hole H_d by etching portions of the UBM 150 and the redistribution pattern 130 overlapping a pattern hole PR3_H of the third photolithography material layer PR3 in the vertical direction, and removing the third photolithography material layer PR3.

In an embodiment, the third photolithography material layer PR3 may be doped on the second insulating layer 140 and the UBM 150 by using a spin coating process. The third photolithography material layer PR3 may include pattern holes PR3_H exposing the second UBM portion 155 of the UBM 150 by using an exposure process and a development process.

In an embodiment, portions of the second UBM portion 155 and the redistribution line pattern 135 overlapping the pattern hole PR3_H of the third photolithography material layer PR3 in the vertical direction may be removed by using an etching process.

In an embodiment, the first insulating layer 120 may work as a stopper in an etching process of the second UBM portion 155 and the redistribution line pattern 135. For example, the second UBM portion 155 and the redistribution line pattern 135 may be etched until a surface of the first insulating layer 120 is exposed.

In an embodiment, the first dummy hole 130H may be defined by the internal surface of the redistribution line pattern 135 and the surface of the first insulating layer 120, and the second dummy hole 150H may be defined by the internal surface of the second UBM portion 155. In addition, the first dummy hole 130H and the second dummy hole 150H together may constitute the dummy hole H_d of the semiconductor package 10. The technical concept of the number and a shape of the dummy hole H_d may be a duplicate of those described with reference to FIGS. 3A through 3D, and detailed descriptions thereof are omitted.

Figure 10G:
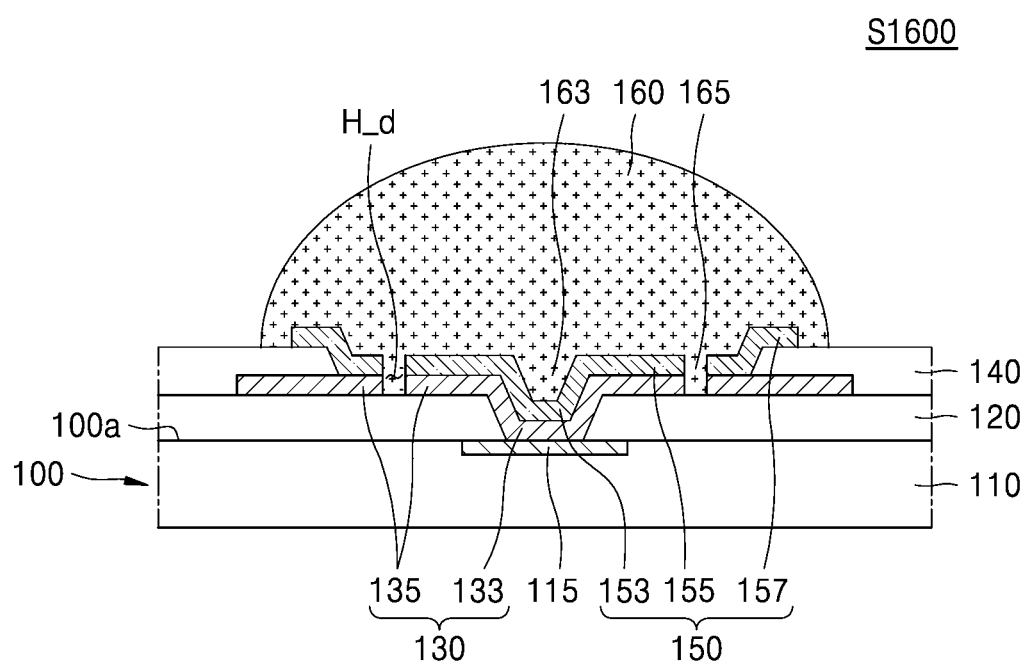

Referring to FIGS. 9 and 10G together, the fabrication method of the semiconductor package 10 according to an embodiment may include the forming of the connection terminal 160 (S1600).

In an embodiment, the connection terminal 160 may be combined with the UBM 150 by being melted by a reflow process. The connection portion 163 of the connection terminal 160 may be melted and may fill a hole formed by the redistribution via pattern 133 and the first UBM portion 153. The connection portion 163 may have a shape convexly protruding in a direction toward the chip pad 115.

In an embodiment, the dummy portion 165 of the connection terminal 160 may be melted and may fill the dummy hole H_d formed by the redistribution line pattern 135 and the second UBM portion 155. Accordingly, the dummy portion 165 of the connection terminal 160 may be surrounded by the internal surface of the redistribution line pattern 135 and the internal surface of the second UBM portion 155.

The fabrication method of the semiconductor package 10 according to an embodiment may include the forming of the dummy hole H_d penetrating portions of the redistribution pattern 130 and the UBM 150 (S1500), and the forming of the connection terminal 160 filling the dummy hole H_d (S1600).

The fabrication method of the semiconductor package 10 according to an embodiment may not have the stress occurring in operation S1600 of forming the connection terminal 160 concentrated to the connection portion 163 of the connection terminal 160, but may distribute the stress to the dummy portion 165.

Accordingly, in the fabrication method of the semiconductor package 10 according to an embodiment, occurrence of cracks and peeling phenomena in the redistribution via pattern 133 and the first UBM portion 153 may be reduced. For example, the structural reliability of the semiconductor package 10 fabricated by using the fabrication method of the semiconductor package 10 may be improved.

FIGS. 11A through 11E are diagrams illustrating individual operations of a fabrication method of the semiconductor package 20, according to example embodiments. The fabrication method of the semiconductor package 20 according to an embodiment may include the fabrication method of the semiconductor package 20 described with reference to FIG. 4.

Figure 11A:
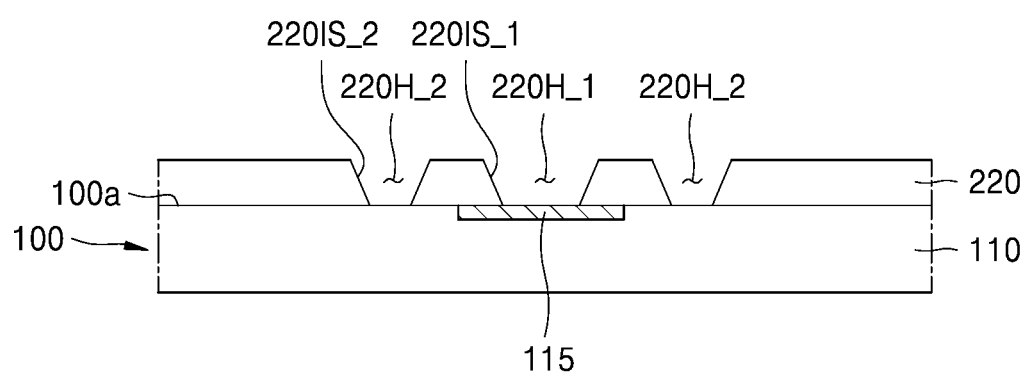
FIGS. 11A through 11E are diagrams illustrating individual operations of a fabrication method of a semiconductor package, according to example embodiments.

Referring to FIG. 11A, the fabrication method of the semiconductor package 20 according to an embodiment may include forming the first insulating layer 220 including the first insulating hole 220H_1 and the second insulating hole 220H_2.

In an embodiment, the first insulating layer 220 may be doped at a uniform thickness on the first surface 100a of the semiconductor chip 100 by using a spin coating process.

In an embodiment, the first insulating hole 220H_1 exposing the chip pad 115, and the second insulating hole 220H_2 exposing a portion of the semiconductor chip 100 outside the first insulating hole 220H_1 may be formed by using a photolithography process and an etching process. However, the embodiment is not limited thereto, and the first insulating hole 220H_1 and the second insulating hole 220H_2 may be formed by using a laser drilling process. The first internal surface 220IS_1 of the first insulating layer 220 may define the first insulating hole 220H_1, and the second internal surface 220IS_2 of the first insulating layer 220 may define the second insulating hole 220H_2.

Figure 11B:
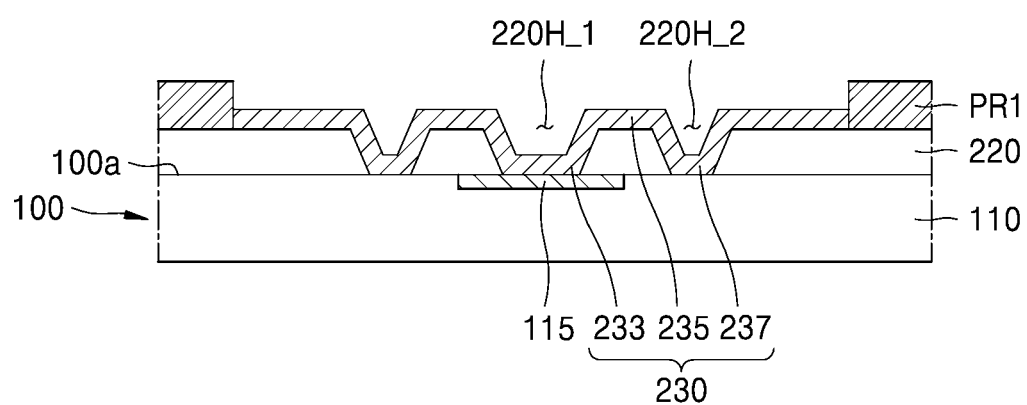

Referring to FIG. 11B, the fabrication method of the semiconductor package 20 according to an embodiment may include forming the redistribution pattern 230.

In an embodiment, the forming of the redistribution pattern 230 may include forming the redistribution seed layer (not illustrated) on the first insulating layer 220, doping the first photolithography material layer PR1 on the first insulating layer 220 and patterning the first photolithography material layer PR1, and forming the redistribution dummy pattern 237.

In an embodiment, the redistribution seed layer (not illustrated) may be conformally formed along the surface of the first insulating layer 220. For example, the redistribution seed layer may be formed on the surface of the first insulating layer 220 by using a physical vapor deposition process.

In addition, in an embodiment, the first photolithography material layer PR1 may be doped on the first insulating layer 220 by using a spin coating process. The first photolithography material layer PR1 may include pattern holes for arranging the redistribution pattern 230 by using an exposure process and a development process.

In an embodiment, the redistribution via pattern 233, redistribution line pattern 135, and the redistribution dummy pattern 237 may be formed by using a plating process utilizing the redistribution seed layer exposed by the first photolithography material layer PR1.

In an embodiment, the redistribution via pattern 233 may be conformally formed along an internal surface 120IS_1 defining the first insulating hole 220H_1 of the first insulating layer 220 and along one surface of the chip pad 115. Accordingly, the redistribution via pattern 233 may have a shape convexly bent in a direction toward the chip pad 115.

In addition, in an embodiment, the redistribution line pattern 235 may be formed to extend on the surface of the first insulating layer 220 in the horizontal direction.

In addition, in an embodiment, the redistribution dummy pattern 237 may be conformally formed along an internal surface 120IS_2 defining the second insulating hole 220H_2 of the first insulating layer 220 and along the first surface 100a of the semiconductor chip 100. Accordingly, the redistribution dummy pattern 237 may have a shape bent in a direction toward the first surface 100a of the semiconductor chip 100.

After the forming of the redistribution via pattern 233, the redistribution line pattern 235, and the redistribution dummy pattern 237 is performed, an operation of removing the first photolithography material layer PR1 may be performed.

Figure 11C:
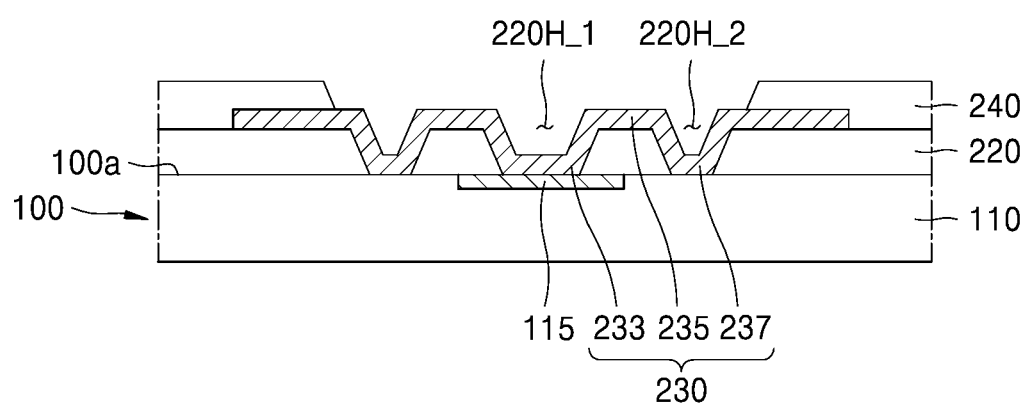

Referring to FIG. 11C, the fabrication method of the semiconductor package 20 according to an embodiment may include forming the second insulating layer 240 on the first insulating layer 220.

In an embodiment, the second insulating layer 240 may be doped on the first insulating layer 220 at a uniform thickness by using a spin coating process. In addition, a portion of the second insulating layer 240 may be removed by using a photolithography process and an etching process. Accordingly, the redistribution via pattern 233, the redistribution line pattern 235, and the redistribution dummy pattern 237 may be exposed by the second insulating layer 240.

Figure 11D:
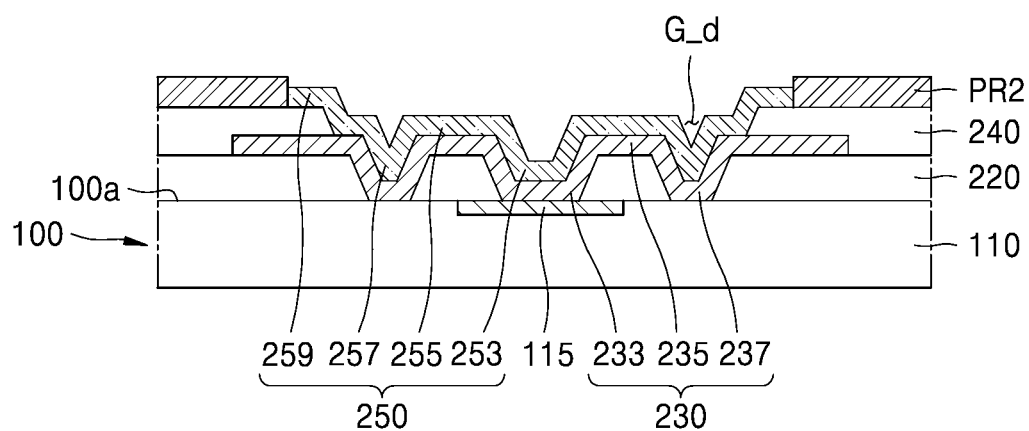

Referring to FIG. 11D, the fabrication method of the semiconductor package 20 according to an embodiment may include forming the UBM 250.

In an embodiment, the forming of the UBM 250 may include forming the UBM seed layer (not illustrated) on the second insulating layer 240, doping the second photolithography material layer PR2 on the second insulating layer 240 and patterning the second photolithography material layer PR2, and forming first, second, and third UBM portions 253, 255, and 259 and the UBM dummy portion 257.

In an embodiment, the UBM seed layer (not illustrated) may be conformally formed along the surface of the redistribution pattern 230 exposed by the second insulating layer 240 and the second insulating layer 240. For example, the UBM seed layer may be formed on the surfaces of the second insulating layer 240 and the redistribution pattern 230 by using a physical vapor deposition process.

In addition, in an embodiment, the second photolithography material layer PR2 may be doped on the second insulating layer 240 by using a spin coating process. The second photolithography material layer PR2 may include pattern holes for arranging the UBM 250 by using an exposure process and a development process.

In an embodiment, the forming of the first, second, and third UBM portions 253, 255, and 259 and the UBM dummy portion 257 may include forming the first, second, and third UBM portions 253, 255, and 259 and the UBM dummy portion 257 by using a plating process utilizing the UBM seed layer exposed by the second photolithography material layer PR2.

In an embodiment, the first UBM portion 253 may be conformally formed along the surface of the redistribution via pattern 233. Accordingly, the first UBM portion 253 may have a shape convexly bent in a direction toward the chip pad 115.

In an embodiment, the second UBM portion 255 may be conformally formed along a surface of the redistribution line pattern 235. The second UBM portion 255 may extend from the outside of the first UBM portion 253, and may be arranged on the redistribution line pattern 235.

In an embodiment, the UBM dummy portion 257 may be conformally formed along the surface of the redistribution dummy pattern 237. The UBM dummy portion 257 may extend outward from the second UBM portion 255, and may be arranged on the redistribution dummy pattern 237. Accordingly, the UBM dummy portion 257 may have a shape convexly bent in a direction toward the first surface 100a of the semiconductor chip 100.

Figure 11E:
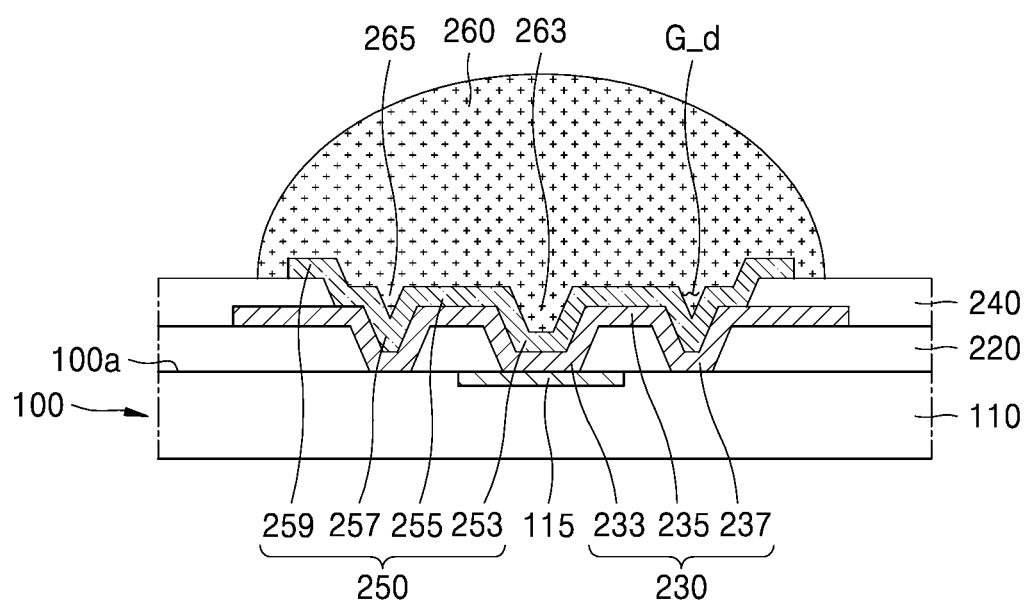

In an embodiment, due to the shape of the UBM dummy portion 257, a structure of FIG. 11E may include a dummy groove G_d concavely formed in a direction toward the first surface 100a of the semiconductor chip 100. The technical concept of the number and a shape of the dummy groove G_d may be a duplicate of those described with reference to FIGS. 6A through 6C, and detailed descriptions thereof are omitted.

In an embodiment, the third UBM portion 259 may be conformally formed along a surface of the second insulating layer 240 exposed by the second photolithography material layer PR2. The third UBM portion 259 may extend from the outside of the UBM dummy portion 257, and may be arranged on the second insulating layer 240.

In an embodiment, the forming of the first, second, and third UBM portions 253, 255, and 259 and the UBM dummy portion 257 is performed, an operation of removing the second photolithography material layer PR2 may be performed.

Referring to FIG. 11E, the fabrication method of the semiconductor package 20 according to an embodiment may include forming the connection terminal 260.

In an embodiment, the connection terminal 260 may be combined with the UBM 250 by being melted by a reflow process. In an embodiment, the connection portion 163 of the connection terminal 260 may be melted, and may fill a groove formed by the redistribution via pattern 233 and the first UBM portion 253. The connection portion 263 may have a shape convexly protruding in a direction toward the chip pad 115.

In an embodiment, the dummy portion 265 of the connection terminal 260 may be melted, and may fill the dummy groove G_d formed by the redistribution dummy pattern 237 and the UBM dummy portion 257. Accordingly, the dummy portion 265 of the connection terminal 260 may be surrounded by the internal surface of the UBM dummy portion 257.

The fabrication method of the semiconductor package 20 according to an embodiment may include forming the dummy groove G_d by using the redistribution dummy pattern 237 and the UBM dummy portion 257, and forming the connection terminal 260 filling the dummy groove G_d.

The fabrication method of the semiconductor package 20 according to an embodiment may not have the stress occurring in an operation of forming the connection terminal 260 concentrated to the connection portion 263 of the connection terminal 260, but may distribute the stress to the dummy portion 265.

Accordingly, in the fabrication method of the semiconductor package 20 according to an embodiment, occurrence of cracks and peeling phenomena in the redistribution via pattern 233 and the first UBM portion 253 may be reduced. For example, the structural reliability of the semiconductor package 20 fabricated in the fabrication method of the semiconductor package 20 may be improved.

While the inventive concept has been particularly shown and described with reference to embodiments thereof, it will be understood that various changes in form and details may be made therein without departing from the spirit and scope of the following claims.

What is claimed is:
1. A semiconductor package comprising:
a semiconductor chip comprising a chip pad on a first surface of the semiconductor chip;
a first insulating layer arranged on the semiconductor chip, and comprising a first insulating hole exposing the chip pad and a second insulating hole spaced apart from the chip pad;
a redistribution pattern comprising a redistribution via pattern arranged on an internal surface of the first insulating layer that is configured to define the first insulating hole and on a surface of the chip pad, a redistribution dummy pattern arranged on an internal surface of the first insulating layer that is configured to define the second insulating hole and on the first surface of the semiconductor chip, and a redistribution line pattern arranged to extend on a surface of the first insulating layer in a horizontal direction and configured to connect the redistribution via pattern to the redistribution dummy pattern;
an under bump metal (UBM) comprising a first UBM portion arranged on the redistribution via pattern, a second UBM portion extending from the first UBM portion and arranged on the redistribution line pattern, and a UBM dummy portion extending from the second UBM portion and arranged on the redistribution dummy pattern; and
a connection terminal arranged on the UBM, and comprising a dummy portion configured to fill a dummy groove formed by the redistribution dummy pattern and the UBM dummy portion, wherein the dummy portion of the connection terminal has a shape concavely protruding in a direction toward the first surface of the semiconductor chip.

2. The semiconductor package of claim 1, wherein the dummy portion of the connection terminal does not overlap the chip pad in vertical direction.

3. The semiconductor package of claim 1, wherein, when the semiconductor package is seen in a planar view, the dummy portion of the connection terminal is spaced apart from the chip pad.

4. The semiconductor package of claim 1, wherein the redistribution dummy pattern and the UBM dummy portion have a shape convexly bent in a direction toward the first surface of the semiconductor chip.

5. The semiconductor package of claim 1, wherein the redistribution via pattern, the redistribution line pattern, and the redistribution dummy pattern are a homogeneous monolithic structure.

6. The semiconductor package of claim 1, wherein the first UBM portion, the second UBM portion, and the UBM dummy portion are a homogeneous monolithic structure.

7. The semiconductor package of claim 1, wherein the redistribution dummy pattern and the UBM dummy portion are spaced apart from the chip pad.

8. The semiconductor package of claim 1, further comprising:
a second insulating layer arranged on the first insulating layer and covering a portion of the redistribution line pattern,
wherein the UBM further comprises a third UBM portion extending from the second UBM portion and arranged on a surface of the second insulating layer.

9. The semiconductor package of claim 1,
wherein a width of the redistribution via pattern is less than a width of the chip pad, and
wherein a width of the second UBM portion is greater than the width of the chip pad.

10. The semiconductor package of claim 1,
wherein the dummy portion of the connection terminal is surrounded by an internal surface of the UBM dummy portion,
wherein the UBM dummy portion is surrounded by an internal surface of the redistribution dummy pattern, and
wherein the redistribution dummy pattern is surrounded by an internal surface of the first insulating layer.

11. The semiconductor package of claim 1, wherein, when the semiconductor package is seen in a planar view, the dummy portion of the connection terminal is in a ring shape surrounding a portion of the chip pad.

12. The semiconductor package of claim 11, wherein a center of the dummy portion of the connection terminal coincides with a center of the chip pad.

13. The semiconductor package of claim 1,
wherein the dummy portion of the connection terminal comprises a plurality of dummy portions, and
wherein each of the plurality of dummy portions is in a half-arc shape arranged at an interval of 180 degrees to surround a side surface of the chip pad, or in a quarter-arc shape arranged at an interval of 90 degrees to surround a corner of the chip pad.

14. The semiconductor package of claim 13, wherein the plurality of dummy portions are arranged to be symmetrical with a center line passing through a center of the chip pad as a reference.

15. The semiconductor package of claim 1,
wherein the dummy portion of the connection terminal comprises a plurality of dummy portions, and
wherein each of the plurality of dummy portions is provided in a circular shape or a polygonal shape, and the plurality of dummy portions surround a portion of the chip pad.

16. A semiconductor package comprising:
a semiconductor chip comprising a chip pad on a first surface of the semiconductor chip;
a first insulating layer arranged on the semiconductor chip, and comprising a first insulating hole exposing the chip pad;
a redistribution pattern comprising a redistribution via pattern arranged on an internal surface of the first insulating layer that is configured to define the first insulating hole and on a surface of the chip pad, and a redistribution line pattern arranged on a surface of the first insulating layer;
an under bump metal (UBM) conformally arranged along a surface of the redistribution pattern; and
a connection terminal arranged on the UBM,
wherein the redistribution line pattern and the UBM provide a dummy space of a shape concavely protruding in a direction toward the first surface of the semiconductor chip, do not overlap the chip pad in vertical direction, and
wherein a portion of the connection terminal fills the dummy space.

17. The semiconductor package of claim 16,
wherein the first insulating layer comprises a second insulating hole spaced apart from the chip pad,
wherein the redistribution pattern further comprises a redistribution dummy pattern arranged on the internal surface of the first insulating layer that is configured to define the second insulating hole and on the first surface of the semiconductor chip,
wherein the UBM comprises a first UBM portion arranged on the redistribution via pattern, a second UBM portion extending from the first UBM portion and arranged on the redistribution line pattern, and a UBM dummy portion extending from the second UBM portion and arranged on the redistribution dummy pattern, and
wherein the dummy space comprises a dummy groove formed by the redistribution dummy pattern and the UBM dummy portion, and the connection terminal comprises a dummy portion filling the dummy groove.

18. The semiconductor package of claim 17,
wherein the dummy portion of the connection terminal is surrounded by an internal surface of the UBM dummy portion,
wherein the UBM dummy portion is surrounded by an internal surface of the redistribution dummy pattern, and
wherein the redistribution dummy pattern is surrounded by an internal surface of the first insulating layer.

19. The semiconductor package of claim 17, wherein, when the semiconductor package is seen in a planar view, the dummy portion of the connection terminal is in a ring shape surrounding a portion of the chip pad.

20. The semiconductor package of claim 17,
wherein the dummy portion of the connection terminal comprises a plurality of dummy portions, and
wherein each of the plurality of dummy portions is provided in a circular shape or a polygonal shape, and the plurality of dummy portions surround a portion of the chip pad.

* * * * *